(12) United States Patent
Maekawa

(10) Patent No.: US 7,754,572 B2
(45) Date of Patent: Jul. 13, 2010

(54) SEMICONDUCTOR DEVICE AND A METHOD OF MANUFACTURING THEREOF

(75) Inventor: Hisayuki Maekawa, Kurokawa-gun (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 5 days.

(21) Appl. No.: 11/220,595

(22) Filed: Sep. 8, 2005

(65) Prior Publication Data
US 2006/0151840 A1   Jul. 13, 2006

(30) Foreign Application Priority Data
Jan. 11, 2005   (JP)   ............... 2005-003467

(51) Int. Cl.
*H01L 21/336* (2006.01)
(52) U.S. Cl. ............ 438/301; 438/303; 438/306; 257/368; 257/500; 257/E27.059; 257/E27.064
(58) Field of Classification Search .......... 438/301, 438/303, 306; 257/368, E27.059, E27.064, 257/500
See application file for complete search history.

(56) References Cited

U.S. PATENT DOCUMENTS

| | | | | |
|---|---|---|---|---|
| 4,581,101 A | * | 4/1986 | Senoue et al. | 438/706 |
| 5,641,698 A | * | 6/1997 | Lin | 438/305 |
| 5,783,478 A | * | 7/1998 | Chau et al. | 438/592 |
| 6,545,326 B2 | * | 4/2003 | Fukada et al. | 257/388 |
| 6,696,334 B1 | * | 2/2004 | Hellig et al. | 438/230 |
| 6,808,974 B2 | * | 10/2004 | Park et al. | 438/232 |
| 2002/0079544 A1 | * | 6/2002 | Shino | 257/388 |
| 2003/0022434 A1 | * | 1/2003 | Taniguchi et al. | 438/240 |
| 2003/0155618 A1 | * | 8/2003 | Boissonnet et al. | 257/369 |
| 2004/0014285 A1 | * | 1/2004 | Lee et al. | 438/258 |
| 2004/0212019 A1 | * | 10/2004 | Shinohara et al. | 257/368 |
| 2004/0232494 A1 | * | 11/2004 | Nagano et al. | 257/382 |
| 2005/0074941 A1 | * | 4/2005 | Nagatomo | 438/301 |

FOREIGN PATENT DOCUMENTS

JP   H6-140590   5/1994

* cited by examiner

*Primary Examiner*—Lynne A Gurley
*Assistant Examiner*—Meiya Li
(74) *Attorney, Agent, or Firm*—Volentine & Whitt, P.L.L.C.

(57) ABSTRACT

A semiconductor device has a semiconductor substrate, a pair of diffusion layers formed in a predetermined regions of the semiconductor substrate, a gate insulation film formed on a region of the semiconductor substrate being interposed between the pair of the diffusion layers, a gate electrode formed on the gate insulation film, insulation films formed on the sides of the gate electrode, each of the insulation films being constructed from one or more layers, sidewall spacers formed on the sides of the gate electrode while the insulation films are interposed between the sidewall spacers and the gate electrode, and highly doped diffusion layers formed in the diffusion layers except for the parts under the insulation films and the sidewall spacers.

7 Claims, 21 Drawing Sheets

SEMICONDUCTOR DEVICE AND A METHOD OF MANUFACTURING THEREOF

CROSS-REFERENCE TO RELATED APPLICATIONS

This application claims priority to Japanese Patent Application No. 2005-3467. The entire disclosure of Japanese Patent Application No. 2005-3467 is hereby incorporated herein by reference.

BACKGROUND OF THE INVENTION

1. Field of the Invention

The present invention generally relates to a semiconductor device. More specifically, the present invention relates to a semiconductor device, which has a transistor for high withstand voltage and a transistor for high speed operation mounted together thereon, and to a method of manufacturing such a semiconductor device.

2. Background Information

Conventionally, semiconductor devices that have two field effect transistors (hereinafter referred to as FETs) having different characteristics such as an FET for high withstand voltage and an FET for high speed operation mounted together on a single chip are known. In the following description, the FET with high withstand voltage will be called a high voltage FET, and the FET for high speed operation, i.e. a FET which is not designed for high withstand voltage, will be called a low voltage FET.

In order to acquire the desired operating characteristics, the low voltage FET does not have the structure for generally realizing high withstand voltage. That is, in order for the high voltage FET and the low voltage FET to satisfy the characteristics each of them requires, parts of their respective structures must be different. For instance, when compared with an MOS (metal-oxide semiconductor) FET designed for high withstand voltage (hereinafter referred to as high voltage MOSFET), a MOSFET designed for low withstand voltage (hereinafter referred to as low voltage MOSFET) has a short gate length and a shallow impurity diffusion distribution in the source and drain regions. On the other hand, the high voltage MOSFET has a comparatively long gate length and a comparatively deep impurity diffusion distribution in the source and drain regions. Furthermore, with respect to the high voltage MOSFET, a distance between a gate electrode and a source electrode and a distance between the gate electrode and a drain electrode are respectively longer than those in the low voltage MOSFET. That is, in the high voltage MOSFET, the distance between the gate electrode and the source electrode/the drain electrode is set to be longer than that in the low voltage MOSFET. In the following description, the region between the source electrode or the drain electrode and the gate electrode will be called an inter-electrode offset region, and the distance between the source electrode or the drain electrode and the gate electrode, i.e. the width of the inter-electrode offset region, will be called an inter-electrode offset distance.

Thus, the high voltage MOSFET has a comparatively broad inter-electrode offset region between the source electrode or the drain electrode and the gate electrode. Thereby, a comparatively strong electrical field (henceforth to be referred to as a high electrical field) generated at the gate electrode can be greatly attenuated in the inter-electrode offset region. For this reason, the high voltage MOSFET is capable of being driven by higher voltage than the low voltage MOSFET.

A manufacturing method of a semiconductor device where such a high voltage MOSFET and a low voltage MOSFET are mounted together on a single chip is disclosed in Japanese Patent Application Laid Open No. H08-46183, which is hereby incorporated by reference. In the following, an example of a conventional manufacturing method of a semiconductor device will be shown. The following example is a case where a p-type substrate is used.

First, in a field region of a p-type silicon substrate, an insulation film provided for element isolation (henceforth to be referred to as field oxide) is formed using a LOCOS (local oxidation of silicon) method, for instance. The regions in which the field oxide is not formed are demarcated as active regions where the elements of the high voltage MOSFET and the low voltage MOSFET will be respectively formed. In the following description, the active region for the high voltage MOSFET will be called a high voltage MOSFET region, and the active region for the low voltage MOSFET will be called a low voltage MOSFET region.

After forming the field oxide as mentioned above, gate insulation films are respectively formed in the surfaces of the high voltage MOSFET region and the low voltage MOSFET region by oxidizing the surfaces of those MOSFET regions. Next, after masking the high voltage MOSFET region by a resist using for example, a photolithography technique, the gate insulation film formed in the low voltage MOSFET region is removed using for example, an etching technique. Then, after removing the resist that has been masking the high voltage MOSFET region, the upper surface of the substrate is oxidized to form in the surface of the low voltage MOSFET region a gate insulation film that is thinner than the gate insulation film in the high voltage MOSFET region.

Then, after forming the gate insulation film on each active region as described above, a polysilicon film is formed on the whole surface of the substrate where the field oxide and the gate insulation films are formed, using a CVD (Chemical Vapor Deposition) method for instance. This polysilicon film is then patterned using for instance, the photolithography technique and the etching technique. Thereby a gate electrode is formed on each gate insulation film.

Next, after masking the low voltage MOSFET region by a resist using for example, the photolithography technique, negative ions (e.g. phosphorous ions) are implanted into the high voltage MOSFET region using for example, an ionic implantation technique. At this time, since the field oxide, the gate electrode and the resist on the low voltage MOSFET region serve as a mask, the negative ion should be implanted in a predetermined region within a high voltage MOSFET region in a self-aligning manner. The predetermined region where the negative ion is implanted turns into a diffusion region.

Next, after removing the resist that has been covering the low voltage MOSFET region, the high voltage MOSFET region is masked by a resist using for example, the photolithography technique. Then, negative ions (e.g. phosphorous ions) are implanted into the low voltage MOSFET region using for example, the ionic implantation technique. At this time, since the field oxide, the gate electrode, and the resist on the high voltage MOSFET region serve as a mask, the negative ions should be implanted in a predetermined region within a low voltage MOSFET region in a self-aligning manner. The predetermined region where the negative ions are implanted turns into a diffusion region. The resist on the high voltage MOSFET region is to be removed after the ionic implantation in the diffusion region of the low voltage MOSFET region.

After forming the diffusion regions by applying ionic implantation in each active region, an insulator made of silicon nitride is deposited using a CVD method for instance, on the whole surface of the substrate where the gate electrodes, the gate insulation films, and the field oxide are formed. Then anisotropic etching is performed on the insulation film formed at this time. Thereby, sidewall spaces are formed on the side faces of the gate electrode in each active region.

Next, highly doped diffusion layers are formed in a part of the diffusion regions of the high voltage MOSFET region (to be referred to as a first region) and in a part of the diffusion regions of the low voltage MOSFET region (to be referred to as a second region). Here the first region is separated from the gate electrode of the high voltage MOSFET region by a predetermined distance, i.e. the inter-electrode offset distance. The highly doped diffusion layers are to function as a source electrode and a drain electrode. In this process, a resist is formed on the region ranging from the gate electrode of the high voltage MOSFET region to the first region, i.e. on the inter-electrode offset region, using for example, the photolithography technique. Then, negative ions are implanted using the ionic implantation technique, for example. At this time, since the resist is on the high voltage MOSFET region, the gate electrodes and their sidewall spacers, and the field oxide serve as a mask, the negative ion should be implanted into a predetermined region (i.e. the first and the second regions) in a self-aligning manner. The resist on the inter-electrode offset region of the high voltage MOSFET region is to be removed after the highly doped diffusion layers are respectively formed in the first and second regions.

In recent years, more miniaturized MOSFETs are being pursued for the purpose of improving the operation speed of the semiconductor device. In this respect, however, there is a problem that parasitic resistance of drain and source electrodes are no longer able to be disregarded.

As a technology for reducing such parasitic resistance, for example, there is a SALICIDE (Self Aligned Silicide) technology. This SALICIDE technology is a technology for siliciding the upper parts of drain, source, and gate electrodes in a self aligning manner.

Specifically, for example, after forming the gate electrode, drain, and source electrodes (highly doped diffusion layers) as described above, a metal with a high melting point, such as cobalt (Co), titanium (Ti), etc. is deposited over the whole upper surface of the substrate where the gate, drain, and source electrodes are formed, and then a thermal treatment is performed on the surface of the substrate where the high melting point metal is deposited. Thereby, heat reaction occurs between the silicon/polysilicon and the high melting point metal, and each surface of the gate, drain and source electrodes is silicided. That is, salicide films are formed in these surfaces. The high melting point metal which did not cause the heat reaction is to be selectively removed, but since the method for this process is well-known, explanation thereof will be omitted here.

However, in case of siliciding the surfaces of the drain and source electrodes of the high voltage MOSFET using the above-described SALICIDE technology, the inter-electrode offset regions which are not covered with the sidewall spaces are also silicided. In other words, salicide films with low resistance are formed between the sidewall spacer and the drain electrode, and between the sidewall spacer and the source electrode, respectively. Therefore, the inter-electrode offset distance in the high voltage MOSFET becomes substantially the same as that of the low voltage MOSFET, meaning that it happens to be specified by the width of the sidewall spacers. This leads to a problem in that high withstand voltage operation becomes difficult.

In this way, in a method of manufacturing a high voltage FET such as a high voltage MOSFET, it is difficult to apply the SALICIDE technology. Accordingly, miniaturization of a kind of semiconductor device having a high voltage FET mounted thereon has been difficult.

In view of the above, it will be apparent to those skilled in the art from this disclosure that there exists a need for an improved semiconductor device and an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide an improved semiconductor device and method of manufacturing thereof to which the SALICIDE technique can be applied.

In accordance with a first aspect of the present invention, a semiconductor device has a semiconductor substrate, a pair of diffusion layers, a gate insulation film, a gate electrode, insulation films, sidewall spacers, and highly doped diffusion layers. The pair of diffusion layers is formed in predetermined regions of the semiconductor substrate. The gate insulation film is formed on a region of the semiconductor substrate that is interposed between the pair of the diffusion layers. The gate electrode is formed on the gate insulation film. The insulation films are formed on the sides of the gate electrode with each of the insulation films being constructed from one or more layers. The sidewall spacers are formed on the sides of the gate electrode while the insulation films are interposed between the sidewall spacers and the gate electrode. The highly doped diffusion layers are formed in the diffusion layers except for the parts under the insulation films and the sidewall spacers.

In accordance with a second aspect of the present invention, a method of manufacturing a semiconductor device, includes the steps of: preparing a semiconductor substrate having an active region; forming a gate insulation film on the surface of the active region; forming a gate electrode on the gate insulation film; forming a pair of diffusion layers in the active region by applying ionic implantation into the active region while using the gate electrode as a mask; forming a first insulation film on the gate electrode and the gate insulation film, the first insulation film being constructed from one or more layers; forming sidewall spacers on the sides of the gate electrode while the first insulation films are interposed between the sidewall spacers and the gate electrode; exposing the upper surfaces of the gate electrode and the gate insulation film except for the parts under the sidewall spacers and the gate electrode by etching the first insulation film; and forming highly doped diffusion layers in the diffusion layers except for the parts under the sidewall spacers and the gate electrode by applying ionic implantation into the diffusion layers via the gate insulation film.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
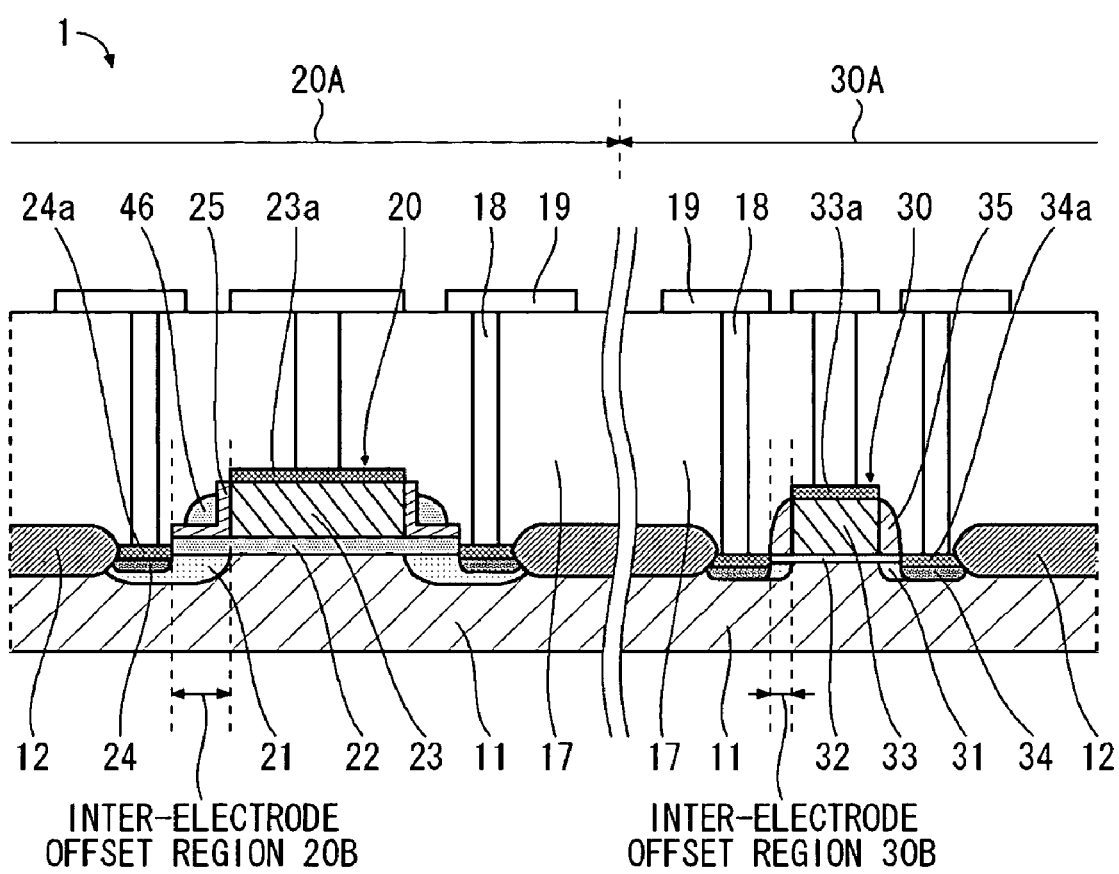
FIG. 1 is a cross-sectional view showing a structure of a semiconductor device according to first and second preferred embodiments of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

(1) First Embodiment

First, a first embodiment of the present invention will be described in detail with reference to the drawings. FIG. 1 is a cross-sectional view showing a structure of a semiconductor device 1 according to the first preferred embodiment of the present invention. The sections shown in FIG. 1 are the sections of the MOSFETs being cut along the source and drain regions. FIGS. 2A to 5C are views of process diagrams showing manufacturing processes in a manufacturing method of the semiconductor device 1.

Structure

As shown in FIG. 1, the semiconductor device 1 has a high voltage MOSFET region 20A (first active region) and a low voltage MOSFET region 30A (second active region). The high voltage MOSFET region 20A has a structure in which a high voltage MOSFET 20 is formed on a silicon substrate 11. The high voltage MOSFET 20 has diffusion layers 21, a gate insulation film 22, a gate electrode 23, highly doped diffusion layers 24, salicide films 23a and 24a, insulation films 25, and sidewall spacers 46. The low voltage MOSFET region 30A has a structure in which a low voltage MOSFET 30 is formed on the silicon substrate 11. The low voltage MOSFET 30 has diffusion layers 31, a gate insulation film 32, a gate electrode 33, highly doped diffusion layers 34, salicide films 33a and 34a, and sidewall spacers 35.

Each of the elements (including the high voltage MOSFET 20 and the low voltage MOSFET 30) formed in the high voltage MOSFET region 20A and the low voltage MOSFET region 30A is isolated from the other elements, which are located horizontally, by field oxides 12. Moreover, an interlayer insulation film 17 is formed on each of the elements (including the high voltage MOSFET 20 and the low voltage MOSFET 30) formed in the high voltage MOSFET region 20A and the low voltage MOSFET region 30A. Thereby, each of those elements is isolated from the other elements formed in other layers. However, the interlayer insulation film 17 has contacts 18 inside opened contact holes, and therefore, each of the elements (including the high voltage MOSFET 20 and the low voltage MOSFET 30) is electrically connected with metal wiring layers 19 formed on another layer (e.g. on the interlayer insulation film 17) through the contacts 18.

In the above structure, for instance, a so-called p-type silicon substrate where p-type impurities are doped is used as the silicon substrate 11, for the purpose of threshold voltage adjustment of diffusion regions (i.e. a drain region, a source region, a channel formation region, etc.). This particular embodiment refers to a case where the p-type silicon substrate is used because this embodiment is about a case where a MOSFET, in which an n-type channel is to be formed, is formed on the substrate. However, when forming a MOSFET, in which a p-type channel is to be formed, on the substrate, a silicon substrate where n-type impurities are doped, for example, should be used as the silicon substrate.

As mentioned above, the field oxides 12 formed on the silicon substrate 11 are insulation layers for electrically separating each of the elements (including the high voltage MOSFET 20 and the low voltage MOSFET 30), which are also formed on the silicon substrate 11, from the other elements. In the following description, in the silicon substrate 11, the region for isolating each element from the other is called an element isolating region (it is also called a field region), and the region in which each element (e.g. the high voltage MOSFET 20 or the low voltage MOSFET 30) is formed is called an element formation region (it is also called an active region). The field oxides 12 are formed in the field regions of the silicon substrate 11. The field oxide 12 is made of an insulator which, for example, is about 2000 Å thick. For this insulator, for example, silicon oxide ($SiO_2$) or the like can be used.

The interlayer insulation film 17 is an insulation layer for isolating each of the elements (including the high voltage MOSFET 20 and the low voltage MOSFET 30) which are formed on the silicon substrate 11, from other layers. The interlayer insulation film 17 is formed so that it buries or covers the elements (including the high voltage MOSFET 20 and the low voltage MOSFET 30) formed on the silicon substrate 11. The interlayer insulation film 17 is made of an insulator whose film thickness over the field oxide 12, for example, is about 10000 Å. For this insulator, for example, silicon oxide ($SiO_2$) or the like can be used.

On the interlayer insulation films 17, the metal wiring layers 19, which are electrically connected to other components, are formed. The metal wiring layer 19 is made of an electric conductor, which, for example, has a film thickness of about 5000 Å. For this electric conductor, for example, metal material such as aluminum (Al), an aluminum alloy, tungsten (W), etc. can be used.

The metal wiring layers 19 on the interlayer insulation films 17 and the salicide films 23a, 33a, 24a, and 34a in the high voltage MOSFET 20 and the low voltage MOSFET 30 are electrically and respectively connected through the contacts 18 formed inside the contact holes opened at the interlayer insulation films 17. That is, the gate electrodes 23 and 33, and the highly doped diffusion layers 24 and 34 that function as a drain electrode or a source electrode in the high voltage MOSFET 20 and the low voltage MOSFET 30 are electrically connected to the metal wiring layers 19 through the salicide films 23a, 33a, 24a, and 34a, and the contacts 18, respectively. For the contact 18, for example, an electrical conductor made of metal material such as aluminum (Al), an aluminum alloy, tungsten (W), etc. can be used.

High Withstand Voltage MOSFET 20

As mentioned above, the high voltage MOSFET 20 (first transistor) formed in the high voltage MOSFET region 20A has the diffusion layers 21, the gate insulation film 22, the gate electrode 23, the highly doped diffusion layers 24, the salicide films 23a and 24a, the insulation films 25, and the sidewall spacers 46 formed on the active region of the silicon substrate 11.

The diffusion layers 21 (first diffusion layer) are source and drain regions in the high voltage MOSFET 20. Therefore, a pair of diffusion layers 21 are formed in the regions (first predetermined region) interposing a region under the gate electrode 23. The region under the gate electrode 23 functions as a channel formation region. The diffusion layers 21 are regions where negative ions have been doped so that for example, the dose amount might be set to about $6.0E12/cm^2$. For the negative ion, phosphorus ion or the like can be used, for example.

On the region (first region) in the silicon substrate 11 which is interposed between the pair of diffusion layers 21, i.e. the channel formation region, the gate insulation film 22 (first gate insulation film) extending to inter-electrode offset regions 20B (q.v. FIG. 1) is formed. This gate insulation film 22 is made of an insulator, which, for example, is about 500 Å thick, and which is thicker than a gate insulation film 32 (q.v. the low voltage MOSFET region 30A in FIG. 1). For this insulator, for example, silicon oxide ($SiO_2$) or the like can be used. In this particular embodiment, silicon oxide ($SiO_2$) is used as the material for forming the gate insulation film 22.

On the gate insulation film 22, the gate electrode 23 (first gate electrode) is formed. That is, the gate electrode 23 is formed on the region interposed between the pair of diffusion layers 21 in a horizontal direction while having the gate insulation film 22 in between the gate electrode 23 and the region interposed between the pair of diffusion layers 21 in a vertical direction. This gate electrode 23 is made of an electric conductor, which for example, is about 3000 Å thick. For this conductor, for example, it is possible to use a polysilicon containing impurities. On the upper surface of the gate electrode 23, the salicide film 23a is formed. This means that the upper surface of the gate electrode 23 is silicided and the parasitic resistance of this part is reduced.

The sidewall spacers 46 (first sidewall spacer) are formed on the side faces of the gate electrode 23 while having the insulation films 25 (first insulation film) in between the gate electrode 23 and the sidewall spacers 46. The cross-sectional form of the insulation film 25 makes an L shape, with the horizontal part of the L-shaped insulation film 25 covering the inter-electrode offset region 20B of the diffusion layer 21 as shown in FIG. 1. The perpendicular part of the L-shaped insulation film 25 is formed along the side face of the gate electrode 23 so that the side face thereof is covered. This insulation film 25, for example, is made of an insulator whose film thickness is about 1000 Å. For the insulator, for example, silicon nitride (SiN), silicon oxide ($SiO_2$), etc. can be used. In the manufacturing method of this particular embodiment, the details of which will be mentioned later, the pre-processed insulation films 25 (equivalent to an insulation film 25A which will be mentioned later) and the pre-processed sidewall spacers 46 (equivalent to an insulation film 26A which will be mentioned later) are selectively and respectively etched using a difference in the etching rate between the two under predetermined etching conditions. The difference in the etching rate between the insulation films 25 and the sidewall spacers 46 under predetermined etching conditions is defined by the materials forming them. Accordingly, for the material forming the insulation films 25, it is desirable to use an insulator having an etching rate under predetermined etching conditions different from that of the material forming the sidewall spacers 46. In this particular embodiment, since silicon oxide ($SiO_2$) is used as the material for forming the gate insulation film 22, for the material forming the insulation films 25, silicon nitride (SiN) is used.

The sidewall spacers 46 are formed on the horizontal parts of the insulation films 25, and along the perpendicular parts of the insulation films 25. In other words, the sidewall spacers 46 are formed on the side faces of the gate electrode 23 while having the insulation films 25 in between the gate electrode 23 and the sidewall spacers 46. The sidewall spacer 46 is made of an insulator, for instance, with a maximum horizontal thickness preferably of about 4500 Å. However, the sidewall spacers 46 in this case are etched by the thickness of the gate insulation film 22 at the time the gate insulation film 22 is patterned by etching. Therefore, the horizontal film thickness of the sidewall spacers 46 before etching the gate insulation film 22, i.e. the horizontal film thickness of sidewall spacers 26 which will be mentioned later is, for example, about 5000 Å. Moreover, although silicon oxide ($SiO_2$), silicon nitride (SiN), etc. can be used as the insulator which forms the sidewall spacers 46, as explained above, it is desirable to use an insulator with an etching rate under predetermined etching conditions different from that of the material forming the insulation films 25. In this particular embodiment, since silicon nitride (SiN) is applied as the material for forming the insulation films 25, silicon oxide ($SiO_2$) is applied as the material for forming the sidewall spacers 46.

In addition, the insulation film 25 and the sidewall spacer 46 are a composition for specifying the region, i.e. the inter-electrode offset region 20B, between the gate electrode 23 and the highly doped diffusion layer 24 (i.e. the drain electrode or the source electrode), and are a composition for protecting the diffusion layer 21 in the inter-electrode offset region 20B from the ion implanted at the time when the highly doped diffusion layer 24 is formed. Therefore, the highly doped diffusion layers 24 are formed in predetermined regions in the diffusion layers 21 in a self-aligning manner due to the insulation film 25 and sidewall spacers 46 which specify the inter-electrode offset regions 20B. This predetermined region is a region that is separated from the gate electrode 23 by a predetermined distance, i.e. the inter-electrode offset distance as shown in FIG. 1 as the region in which the highly doped diffusion layer 24 is formed.

Thus, it is arranged such that the distance between the gate electrode 23 and the highly doped diffusion layer 24 (i.e. the drain electrode or the source electrode) in the horizontal direction is greater than the horizontal distance between the gate electrode 33 and the highly doped diffusion layer 34 in the low voltage MOSFET 30. In other words, by having the inter-electrode offset region 20B with a comparatively long inter-electrode offset distance, it is possible to attenuate greatly the high electric field, which is generated at the gate electrode 23, in the inter-electrode offset region 20B. Therefore, due to such a structure, the high voltage MOSFET 20 is capable of operating at higher voltage than the low voltage MOSFET 30.

On the regions that are the upper parts of the diffusion layers 21 except for the parts under the insulation films 25 and the sidewall spacers 46, i.e. the regions in the upper parts of the diffusion layers 21 except for the inter-electrode offset regions 20B, the highly doped diffusion layers 24 (first highly doped diffusion layer) are formed, as mentioned earlier. As already mentioned, the highly doped diffusion layer 24 is a layer which functions as the drain electrode or the source electrode. The highly doped diffusion layers 24 are regions where negative ions have been doped so that for example, the dose amount might be set to about $2.0E15/cm^2$. For the negative ion, phosphorus ion etc. can be used, for example.

On the upper surfaces of the highly doped diffusion layers 24, the salicide films 24a are formed. Accordingly, due to having the upper surfaces of the highly doped diffusion layers 24 silicided, the parasitic resistance of these parts can be reduced.

Low Withstand Voltage MOSFET 30

As mentioned above, the low voltage MOSFET 30 (second transistor) formed in the low voltage MOSFET region 30A has the diffusion layers 31, the gate insulation film 32, the gate electrode 33, the highly doped diffusion layers 34, the salicide films 33a and 34a, and the sidewall spacers 35 formed on the active region of the silicon substrate 11.

The diffusion layers 31 (second diffusion layer) are source and drain regions in the low voltage MOSFET 30. Therefore, a pair of diffusion layers 31 are formed in the regions (second predetermined region) interposing a region under the gate electrode 33. The region under the gate electrode 33 functions as a channel formation region. The diffusion layers 31 are regions where negative ions have been doped so that for example, the dose amount might be set to about $4.0E13/cm^2$. For the negative ion, phosphorus ion or the like can be used, for example.

On the region (second region) in the silicon substrate 11 which is interposed between the pair of diffusion layers 31, i.e. the channel formation region, the gate insulation film 32 (second gate insulation film) extending to an inter-electrode offset regions 30B (q.v. FIG. 1) is formed in a horizontal direction as shown in FIG. 1. This gate insulation film 32 is made of an insulator which, for example, is preferably about 100 Å thick, and which is thinner than the gate insulation film 22 (q.v. the high voltage MOSFET region 20A in FIG. 1). For this insulator, for example, silicon oxide ($SiO_2$) or the like can be used. In this particular embodiment, silicon oxide ($SiO_2$) is used as the material for forming the gate insulation film 32.

On the gate insulation film 32, the gate electrode 33 is formed. That is, the gate electrode 33 (second gate electrode) is formed on the region interposed between the pair of diffusion layers 31 while having the gate insulation film 32 in between the gate electrode 33 and the region interposed between the pair of diffusion layers 31. As with the gate electrode 23 in the high voltage MOSFET region 20A, the gate electrode 33 is made of an electric conductor, which for example, is preferably about 3000 Å thick. For this conductor, for example, it is possible to use a polysilicon containing impurities. On the upper surface of the gate electrode 33, the salicide film 33a is formed. This means that the upper surface of the gate electrode 33 is silicided and the parasitic resistance of this part is reduced.

The sidewall spacers 35 (second sidewall spacer) are formed on the side faces of the gate electrode 33. The sidewall spacer 35 is made of an insulator, for instance, with a maximum horizontal thickness of about 1000 Å. For the insulator, for example, silicon nitride (SiN), silicon oxide ($SiO_2$), etc. can be used. As mentioned earlier, in the manufacturing method of this particular embodiment (details will be mentioned later), the pre-processed sidewall spacers 35 (equivalent to the insulation film 25A which will be mentioned later) are selectively etched using a difference in the etching rate between the sidewall spacers 35 and the sidewall spacers 46 under predetermined etching conditions. The difference in the etching rate between the sidewall spacers 35 and the sidewall spacers 46 is defined by the materials forming them. Accordingly, for the material forming the sidewall spacers 35, it is desirable to use an insulator having an etching rate under predetermined etching conditions different from that of the material forming the sidewall spacers 46. In this particular embodiment, silicon nitride (SiN) is used for the material forming the sidewall spacers 35, which is the same material used for forming the above-mentioned insulation film 25.

In addition, the sidewall spacer 35 is a composition for specifying the region, i.e. the inter-electrode offset region 30B, between the gate electrode 33 and the highly doped diffusion layer 34 (i.e. the drain electrode or the source electrode), and is a composition to protect the diffusion layer 31 in the inter-electrode offset region 30B from the ions implanted at the time when the highly doped diffusion layer 34 is formed. Therefore, the highly doped diffusion layers 34 are formed in predetermined regions in a self-aligning manner due to the sidewall spacers 35 that specify the inter-electrode offset regions 30B. This predetermined region is a region that is separated from the gate electrode 33 by a predetermined distance, i.e. the inter-electrode offset distance, as shown in FIG. 1 as the region in which the highly doped diffusion layer 34 is formed.

On the regions that are the upper parts of the diffusion layers 31 except for the parts under the sidewall spacers 35, i.e. the regions in the upper parts of the diffusion layers 31 except for the inter-electrode offset regions 30B, the highly doped diffusion layers 34 (second highly doped diffusion layer) are formed, as mentioned earlier. As already mentioned, the highly doped diffusion layer 34 is a layer that functions as the drain electrode or the source electrode. The highly doped diffusion layers 34 are regions where negative ions have been doped so that, for example, the dose amount might be set to about $2.0E15/cm^2$, which is the same as the case of the highly doped diffusion layers 24 in the high voltage MOSFET 20. For the negative ion, phosphorus ion etc. can be used, for example.

On the upper surfaces of the highly doped diffusion layers 34, the salicide films 34a are formed, as with the case of the highly doped diffusion layers 24 in the high voltage MOSFET 20. Accordingly, due to having the upper surfaces of the highly doped diffusion layers 34 silicided, the parasitic resistance of these parts can be reduced.

Manufacturing Method

Figure 2A:
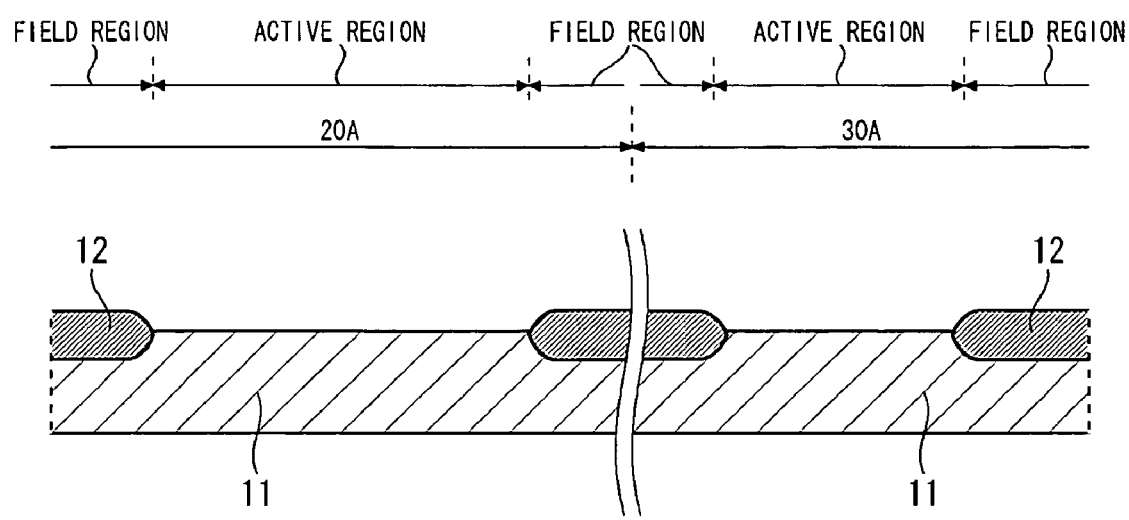
FIGS. 2A to 5C are views of process diagrams showing manufacturing processes in a manufacturing method of the semiconductor device according to the first embodiment of the present invention.

Next, a manufacturing method of the semiconductor device 1 will be described with reference to FIGS. 2A to 5C. First, the p-type silicon substrate is prepared as the silicon substrate 11, and as shown in FIG. 2A, the field oxides 12, which are made of silicon oxide ($SiO_2$) are formed in the predetermined regions of the prepared silicon substrate 11, using the LOCOS (local oxidation of silicon) method. Therefore, the field regions and the active regions are demarcated in the silicon substrate. For example, the film thickness of the field oxide 12 is preferably about 2000 Å. Instead of using the LOCOS method, it is also possible to use a STI (shallow trench isolation) method.

Figure 2B:
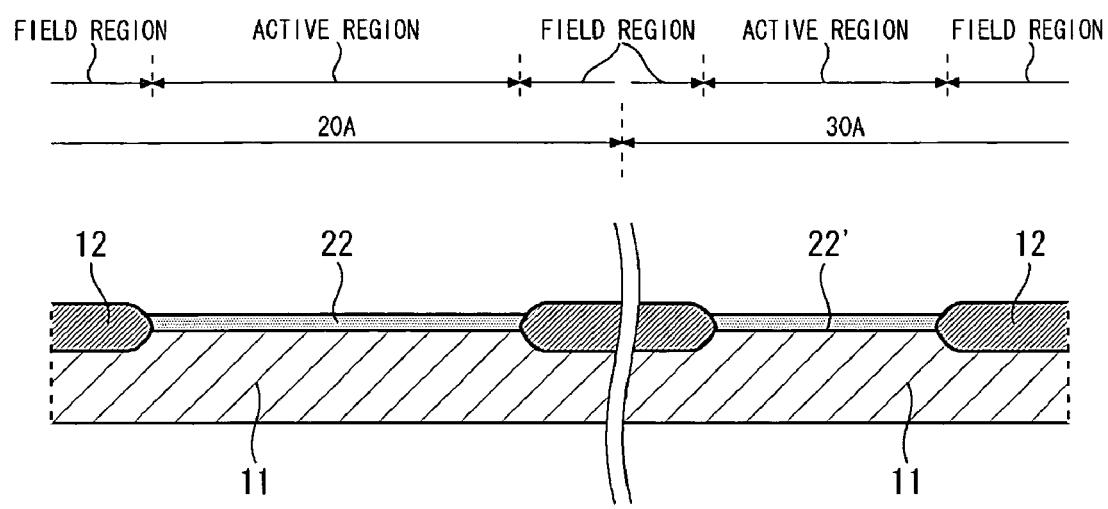

Then, as shown in FIG. 2B, the active regions of the silicon substrate 11 where the field oxides 12 are not formed, are oxidized to form respectively gate insulation films 22 and 22' on the surface of the silicon substrate 11 in the high voltage MOSFET region 20A and the surface of the silicon substrate 11 in the low voltage MOSFET region 30A. The gate insulation films 22 and 22' are, for example, made of silicon oxide ($SiO_2$), and are preferably about 500 Å thick.

Figure 2C:
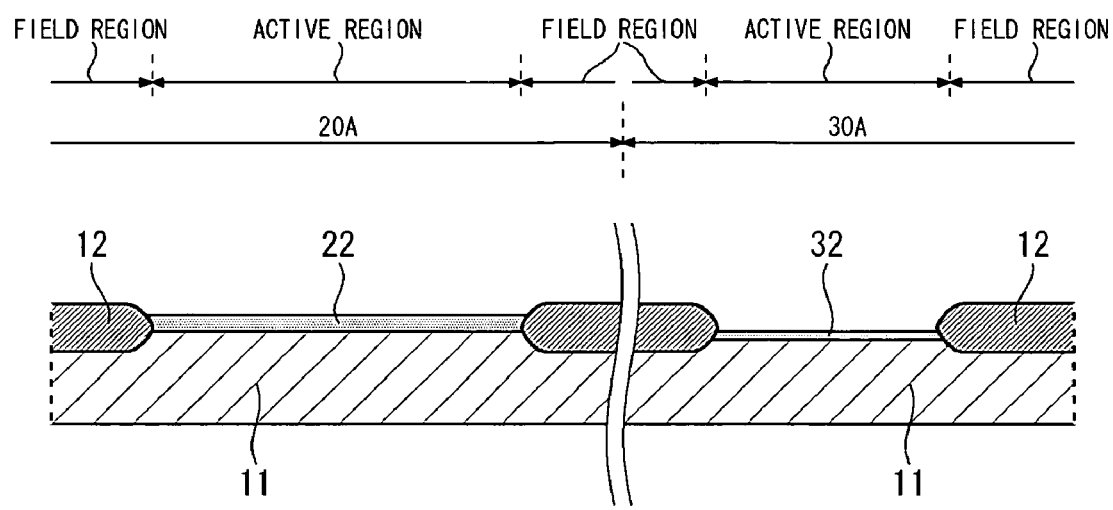

Next, after masking the high voltage MOSFET region 20A by a resist, using for example the photolithography technique, the gate insulation film 22' formed in the low voltage MOSFET region 30A is removed using the etching technique, for example. Thereby, the upper surface of the silicon substrate 11 in the low voltage MOSFET region 30A is exposed. Then, the resist that has been masking the high voltage MOSFET region 20A is removed, and as shown in FIG. 2C, the surface of the active regions, i.e. the upper surface of the silicon substrate 11, is oxidized again to form the gate insulation film 32, which, for example, is a silicon oxide ($SiO_2$) film with a thickness preferably of about 100 Å, and which is thinner than the gate insulation film 22 of the high voltage MOSFET region 20A.

Figure 2D:
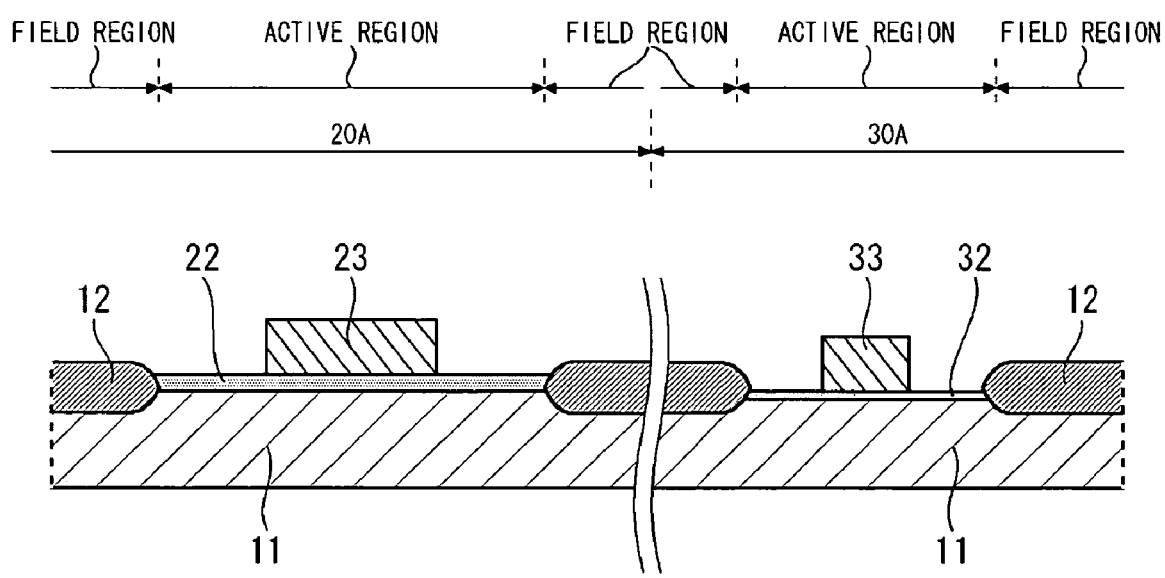

After the gate insulation films 22 and 32 are respectively formed in the active regions in the high voltage MOSFET region 20A and the low voltage MOSFET region 30A in the above described manner, a polysilicon film is formed on the whole upper surface of the silicon substrate 11 where the field oxides 12 and the gate insulation films 22 and 32 are formed, using a CVD method, for example. This polysilicon film is, for example, preferably set to be about 3000 Å thick. Then the polysilicon film is patterned using the photolithography technique and the etching technique, for example. Thereby, as shown in FIG. 2D, the gate electrodes 23 and 33 whose film thickness is preferably about 3000 Å are respectively formed on the gate insulation films 22 and 32.

Figure 3A:
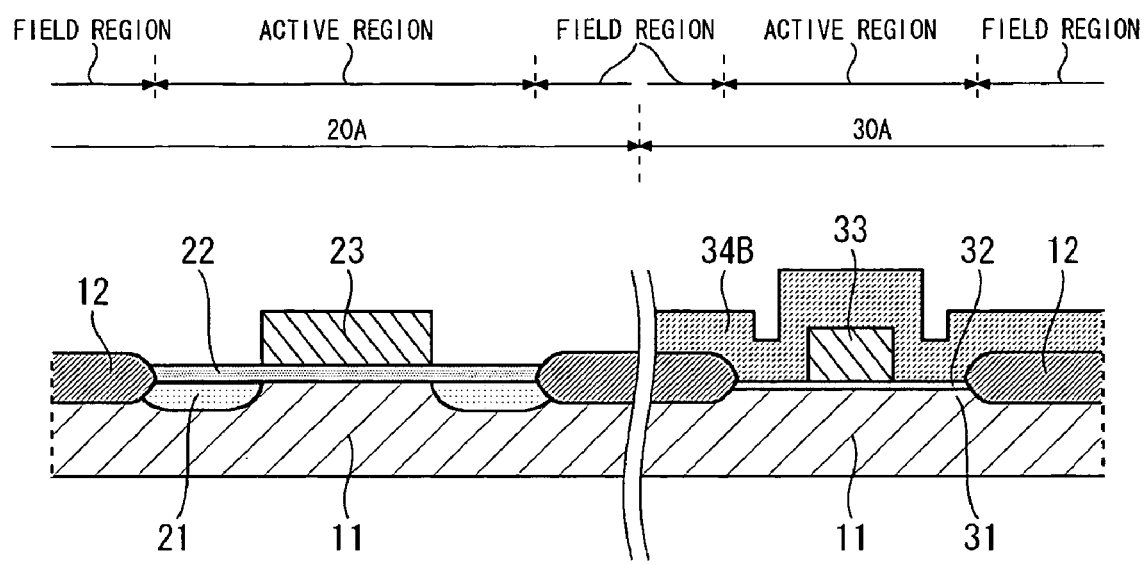

Next, as shown in FIG. 3A, the low voltage MOSFET region 30A is masked by a resist 34B using the photolithography technique, for example, and then negative ions (e.g. phosphorous ions) are implanted into the high voltage MOSFET region 20A using the ionic implantation technique, for example. Here the dose amount of the negative ion for the ionic implantation may set to be about $6.0E12/cm^2$, for example. Furthermore, at this time, the negative ion is accelerated to about 70 KeV (kilo electron volt), for example. In this process, since the field oxides 12, the gate electrode 23, and the resist 34B in the low voltage MOSFET region 30A function as a mask, the negative ion should be implanted into a predetermined region, the diffusion layers 21 shown in FIG. 1, within the high voltage MOSFET region 20A in a self-aligning manner.

Figure 3B:
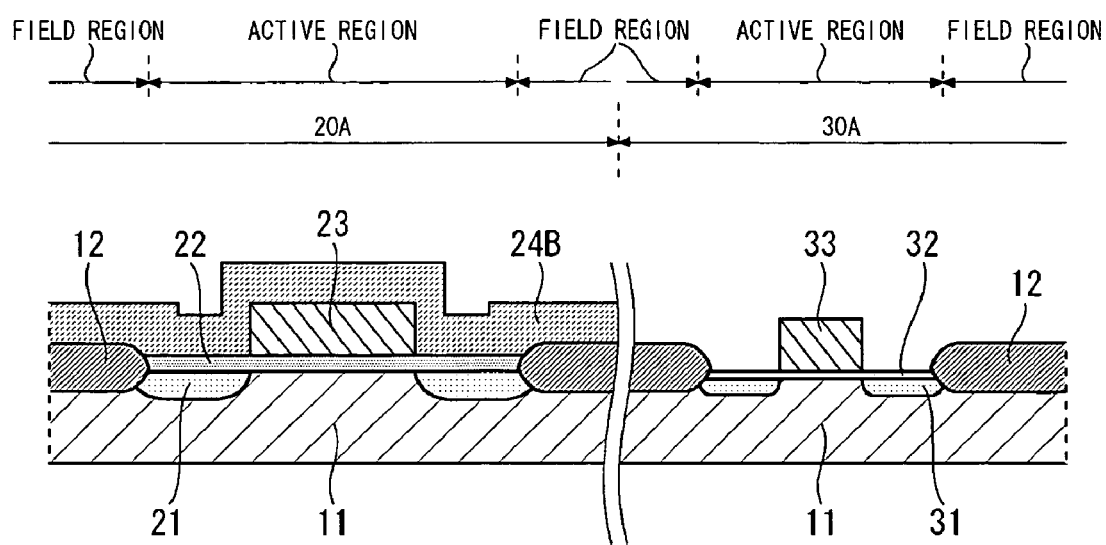

After removing the resist 34B covering the low voltage MOSFET region 30A, this time, as shown in FIG. 3B, the low voltage MOSFET region 20A is masked by a resist 24B using the photolithography technique, for example. Then negative ions (e.g. phosphorous ions), for example, are implanted into the low voltage MOSFET region 30A using the ionic implantation technique, for example. Here the dose amount of the negative ion for the ionic implantation may set to be about $4.0E13/cm^2$, for example. Furthermore, at this time, the negative ions are accelerated to about 70 KeV, for example. In this process, since the field oxides 12, the gate electrode 33 and the resist 24B in the high voltage MOSFET region 20A function as a mask, the negative ion should be implanted into a predetermined region, the diffusion layers 31 shown in FIG. 1, within the low voltage MOSFET region 30A in a self-aligning manner.

Figure 3C:
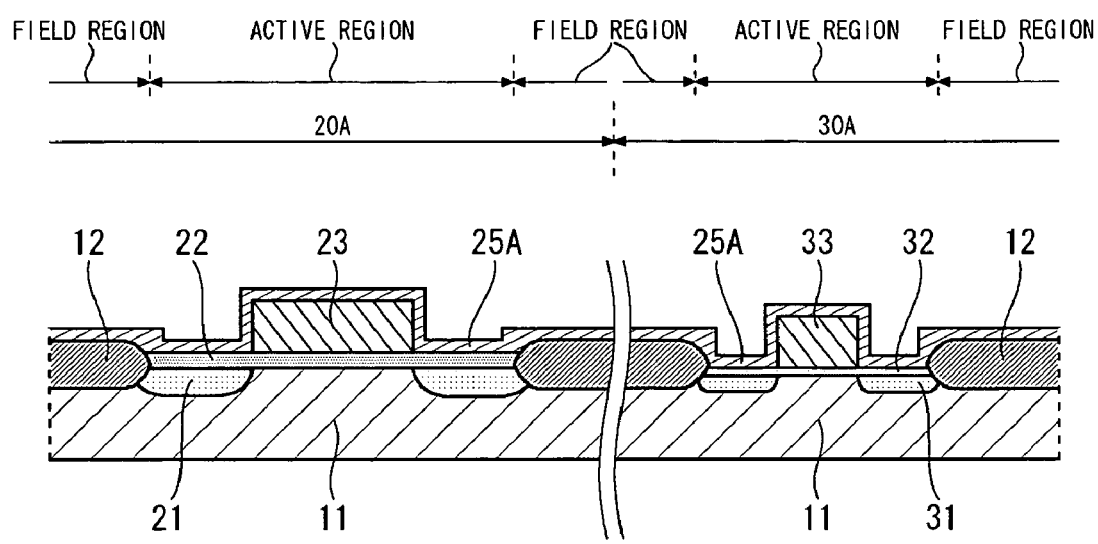

After the diffusion layers 21 and 31 are respectively formed in the high voltage MOSFET region 20A and the low voltage MOSFET region 30A in the above described manner, silicon nitride (SiN) is deposited on the whole upper surface of the silicon substrate 11 where the gate electrodes 23 and 33, the gate insulation films 22 and 32, and the field oxides 12 are formed, using the CVD method, for example. This silicon nitride (SiN) film is, for example, preferably set to be about 1000 Å thick. Thereby, as shown in FIG. 3C, an insulation film 25A whose film thickness is preferably about 1000 Å is formed on the whole upper surface of the substrate.

Figure 3D:
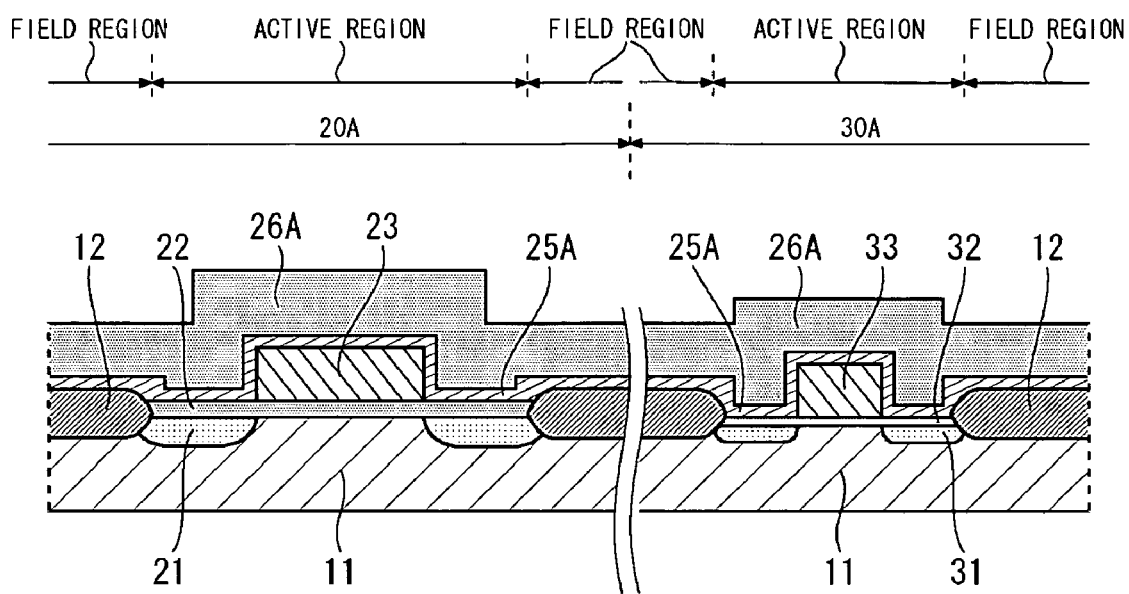

Then, silicon oxide ($SiO_2$) is deposited on the gate insulation film 25A using the CVD method, for example. This silicon oxide ($SiO_2$) film is, for example, preferably set to be about 5000 Å thick. Thereby, as shown in FIG. 3D, an insulation film 26A whose film thickness is about 5000 Å is formed on the whole upper surface of the substrate.

Figure 4A:
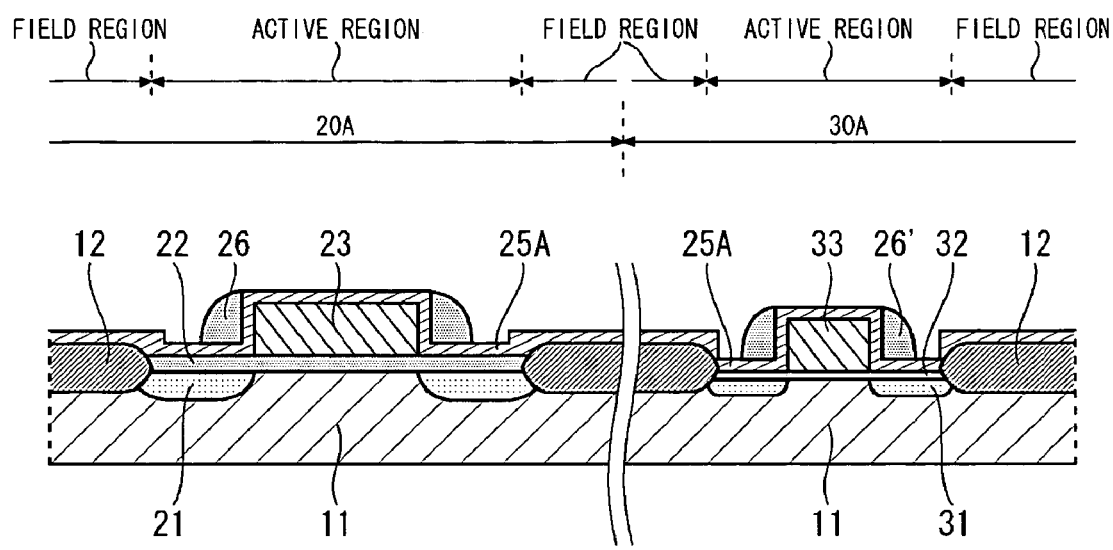

After forming the insulation film 25A made of silicon nitride (SiN) and the insulation film 26A made of silicon oxide ($SiO_2$) are formed on the substrate where the gate electrodes 23 and 33, the gate insulation films 22 and 32, and the field oxides 12, as described above, anisotropic etching is performed on the insulation film 26A, which is made of silicon oxide ($SiO_2$). This anisotropic etching is performed under certain predetermined etching conditions by which a sufficient selection ratio between the insulation film 25A made of silicon nitride (SiN) and the insulation film 26A made of silicon oxide ($SiO_2$) can be acquired when the etching is actually performed. In other words, the anisotropic etching process is performed under the conditions by which only silicon oxide ($SiO_2$) can be selectively etched as opposed to silicon nitride (SiN). By this process, as shown in FIG. 4A, sidewall spacers 26 are formed on the side faces of the gate electrode 23 while having the insulation film 25A interposing the gate electrode 23 and the sidewall spacers 26 in the horizontal direction, while the insulation film 25A remains in the high voltage MOSFET region 20A. Likewise, as shown in FIG. 4A, sidewall spacers 26' are formed on the sides of the gate electrode 33 while having the insulation film 25A in between the gate electrode 33 and the sidewall spacers 26', while the insulation film 25A remains in the low voltage MOSFET region 30A. In this case, the maximum horizontal thickness of the sidewall spacers 26 and 26' is preferably about 5000 Å. With respect to the predetermined etching conditions (first predetermined etching condition) for the etching process, for instance, using a mixed gas of $CF_4/CHF_3$ with a mixture rate of about 1:10 as an etching gas, etc. can be included.

Figure 4B:
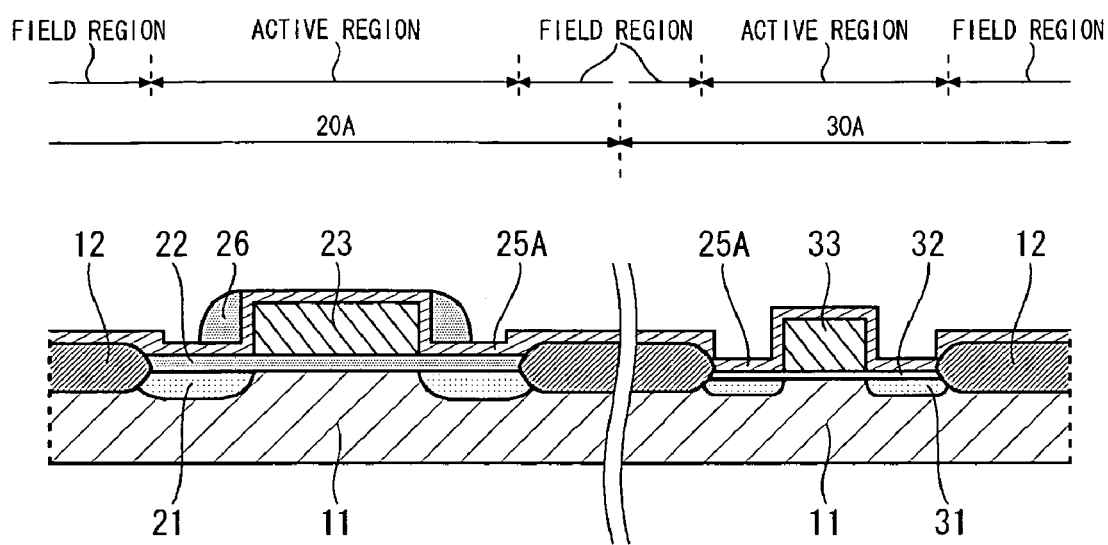

After respectively forming the sidewall spacers 26 and 26' on the side faces of the gate electrodes 23 and 33 while the insulation film 25A remains in the high voltage MOSFET region 20A and the low voltage MOSFET 30A, as shown in FIG. 4B, the sidewall spacers 26' formed in the low voltage MOSFET region 30A are removed by being etched using the photolithography and etching techniques, for example.

Figure 4C:
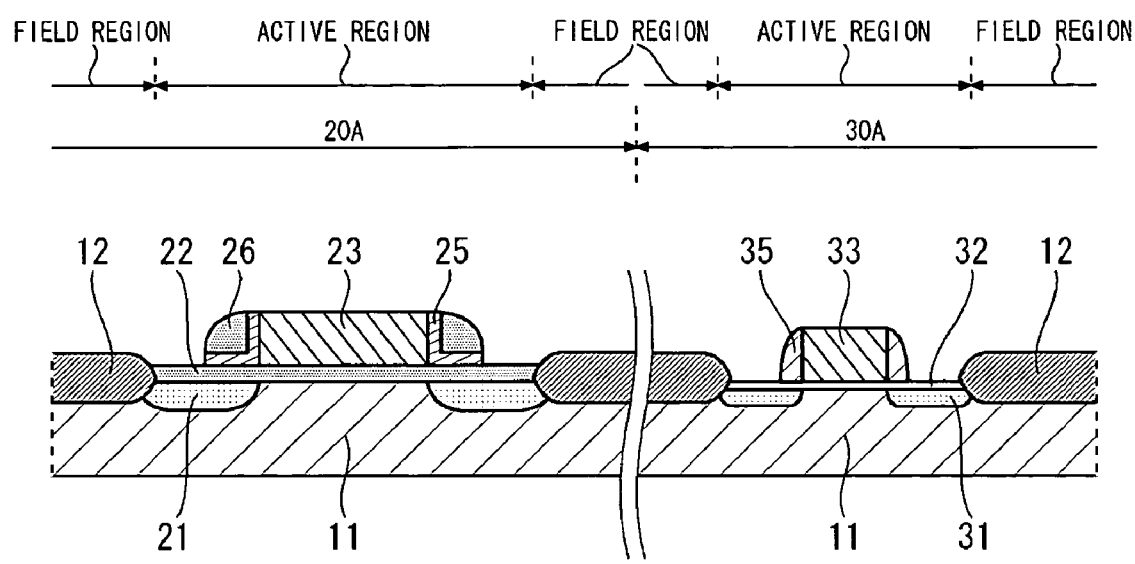

Next, anisotropic etching is performed on the exposed insulation film 25A, which is made of silicon nitride (SiN). This anisotropic etching is performed under certain predetermined etching conditions by which a sufficient selection ratio between the insulation film 25A made of silicon nitride (SiN) and the sidewall spacers 26 made of silicon oxide ($SiO_2$) can be acquired when the etching is actually performed. In other words, the anisotropic etching process is performed under the conditions by which only silicon nitride (SiN) can be selectively etched as opposed to silicon oxide ($SiO_2$). By this process, as shown in FIG. 4C, in the high voltage MOSFET region 20A, the parts of the insulation film 25A which are not covered with the sidewall spacers 26 are removed, and the insulation film 25 having the L shape and a thickness preferably of about 1000 Å is formed in each inter-electrode offset region 20B. At the same time, in the low voltage MOSFET region 30A, sidewall spacers 35 made of silicon nitride (SiN) with a maximum horizontal thickness of about 1000 Å are formed on the side faces of the gate electrode 33. With respect to the predetermined etching conditions (second predetermined etching condition) for the etching process, for instance, using a mixed gas of $CHF_3/Ar/O_2$ with a mixture rate of about 50:100:1 as an etching gas, etc. can be included.

Figure 4D:
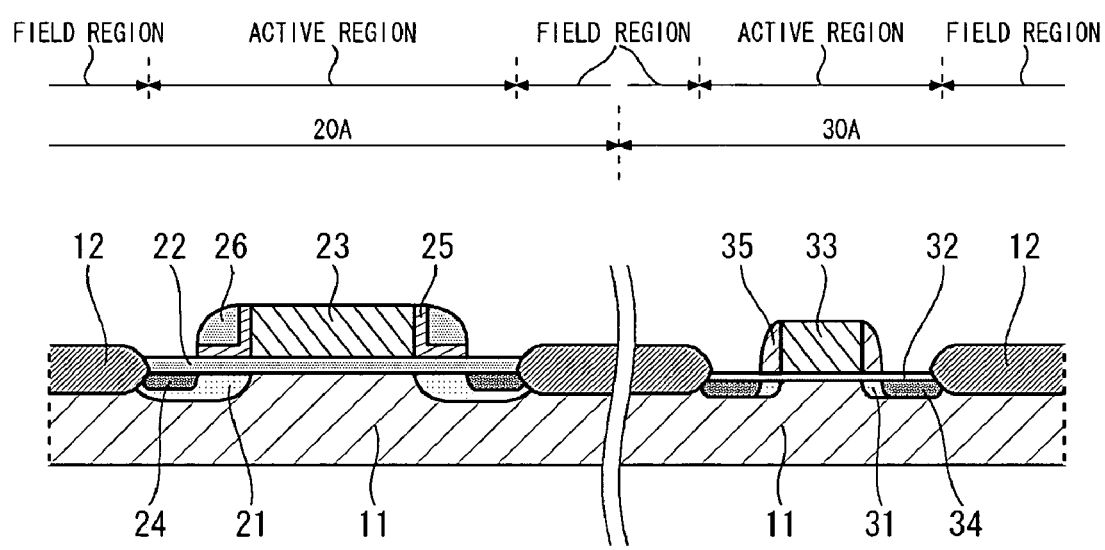

Next, as shown in FIG. 4D, the highly doped diffusion layers 24 are formed in the upper parts of the diffusion layers 21, which are not covered with the insulation film 25 and the sidewall spacers 26, i.e. the regions of the diffusion layers 21 except for the inter-electrode offset regions 20B. Likewise, as shown in FIG. 4D, the highly doped diffusion layers 34 are formed in the upper parts of the diffusion layers 31 which are not covered with the sidewall spacers 35, i.e. the regions of the diffusion layers 31 except for the inter-electrode offset regions 30B. As mentioned above, the highly doped diffusion layers 24 and 34 respectively function as the source and drain electrodes. In this process, negative ions (e.g. phosphorous ions) are implanted using the ionic implantation technique, for example. Here the dose amount of the negative ion for the ionic implantation may set to be about $2.0E15/cm^2$, for example. Furthermore, at this time, the negative ion is accelerated to about 40 KeV, for example. In this process, since the field oxides 12, the gate electrode 23 and 33, the insulation films 25, the sidewall spacers 26 and 35 function as a mask, the negative ions should be respectively implanted into predetermined regions, the highly doped diffusion layers 24 shown in FIG. 1, within the high voltage MOSFET regions 20A and into predetermined regions, the highly doped diffusion layers 34 shown in FIG. 1, within the low voltage MOSFET regions 30A in a self-aligning manner. In this way, in this embodiment, it is possible to form the highly doped diffusion layers 24 in the high voltage MOSFET region 20A and the highly doped diffusion layers 34 in the low voltage MOSFET region 30A at the same time.

Figure 5A:
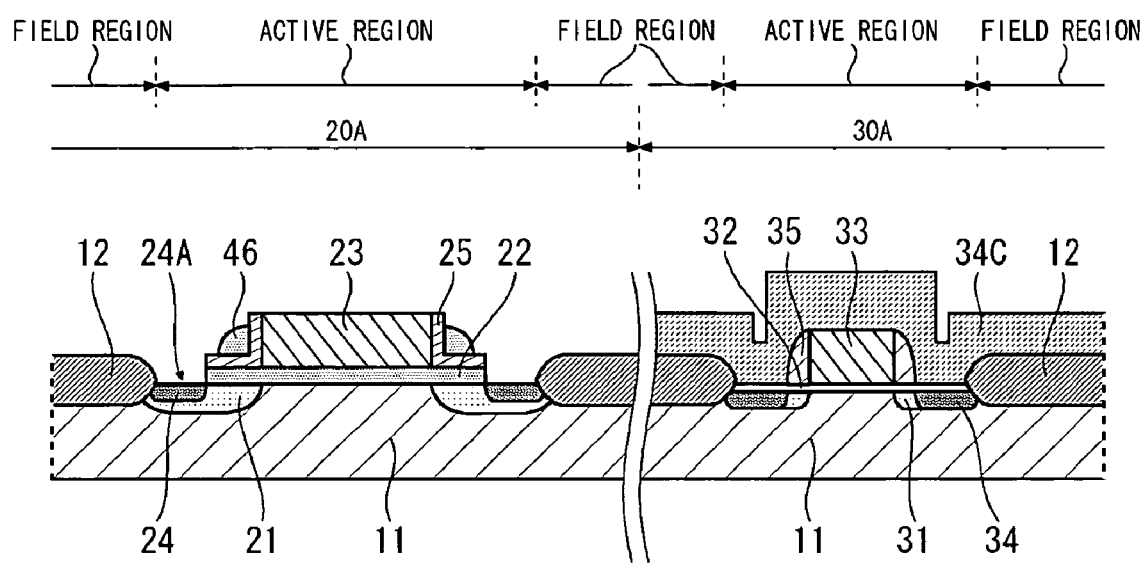

As described above, the highly doped diffusion layers 24 and the highly doped diffusion layers 34 are respectively formed on the diffusion layers 21 and the diffusion layers 31. Then, as shown in FIG. 5A, after masking the low voltage MOSFET region 30A by a resist 34C using, for instance, the photolithography technique, the exposed parts of the gate insulation film 22, i.e. the parts of the gate insulation film 22 which are located in the regions besides the lower part of the gate electrode 23 and the inter-electrode offset regions 20B, are etched under certain predetermined etching conditions by which a sufficient selection ratio between the gate insulation film 22 made of silicon oxide ($SiO_2$) and the insulation films 25 made of silicon nitride (SiN) can be acquired when the etching is actually performed. In other words, the etching process is performed under the conditions by which only silicon oxide ($SiO_2$) can be selectively etched as opposed to silicon nitride (SiN). Through this etching process, as shown in FIG. 5A, apertures 24A which penetrate to the highly doped diffusion layers 24 are formed and parts of the upper surfaces of the highly doped diffusion layers 24 are exposed. At this time, since the sidewall spacers 26, which are made of the same material (i.e. silicon oxide ($SiO_2$)) as the gate insulation film 22, are also etched, the sidewall spacers 26 change into sidewall spacers 46 with a thickness (in the horizontal direction) of about 4500 Å, which is thinner than the original sidewall spacers 26 by the thickness of the gate insulation film 22, which for instance is about 500 Å. With respect to the predetermined etching conditions for the etching process, for instance, using a mixed gas of $CF_4/CHF_3$ with a mixture rate of about 1:10 as an etching gas, etc. can be included.

Figure 5B:
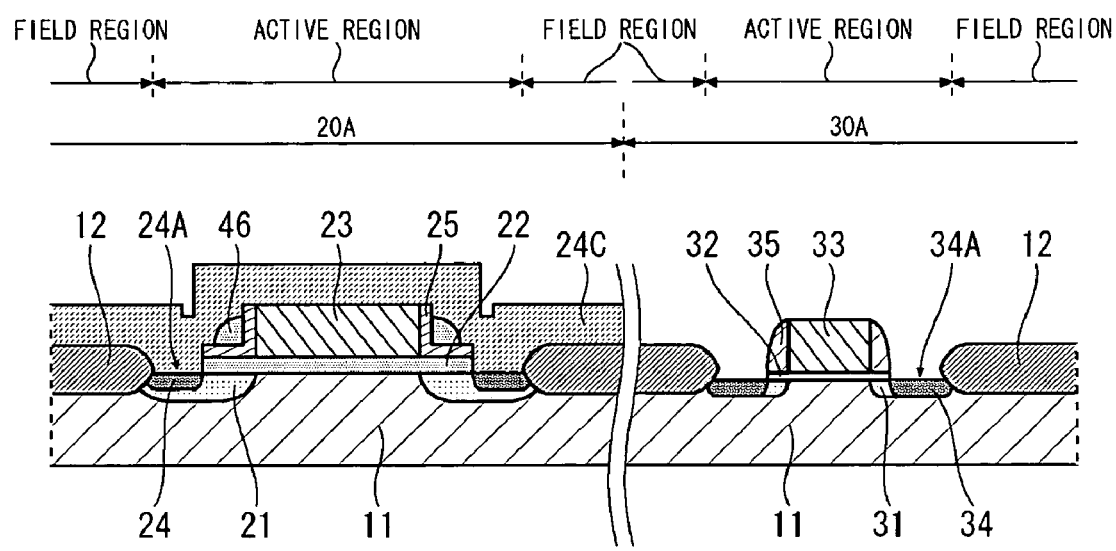

Next, after removing the resist 34C covering the low voltage MOSFET region 30A, the high voltage MOSFET region 20A is masked by a resist 24C, as shown in FIG. 5B. Then the exposed parts of the gate insulation film 32, i.e. the parts of the gate insulation film 32 that are located in the regions besides the lower part of the gate electrode 33 and the inter-electrode offset regions 30B, are etched under certain predetermined etching conditions by which a sufficient selection ratio between the gate insulation film 32 made of silicon oxide ($SiO_2$) and the sidewall spacers 35 made of silicon nitride (SiN) can be acquired when the etching is actually performed. In other words, the etching process is performed under the conditions by which only silicon oxide ($SiO_2$) can be selectively etched as opposed to silicon nitride (SiN). Through this etching process, apertures 34A that penetrate to the highly doped diffusion layers 34 are formed and parts of the upper surfaces of the highly doped diffusion layers 34 are exposed. With respect to the predetermined etching conditions for the etching process, for instance, using a mixed gas of $CF_4/CHF_3$ with a mixture rate of about 1:10 as an etching gas or the like can be included. Furthermore, the resist 24C covering the high voltage MOSFET region 20A is to be removed after the apertures 34A are formed.

It is also possible to form the apertures 24A and 34A shown in FIGS. 5A and 5B at the same time. In such a case, the gate insulation films 22 and 32 should be etched simultaneously under the predetermined etching conditions as mentioned above without respectively masking the high voltage MOSFET region 20A and the low voltage MOSFET 30A by the resist 24C and the resist 34C. The etching amount at this time should be set based on the gate insulation film 22. Under the predetermined etching conditions as mentioned above, a sufficient etching rate can be acquired with respect to silicon (Si) and silicon oxide ($SiO_2$). Therefore, by setting the etching amount based on the thicker film (gate insulation film 22), it is possible to etch each gate insulation film 22 and 32 down to the surface of the highly doped diffusion layer 24 and 34 with precision.

Figure 5C:
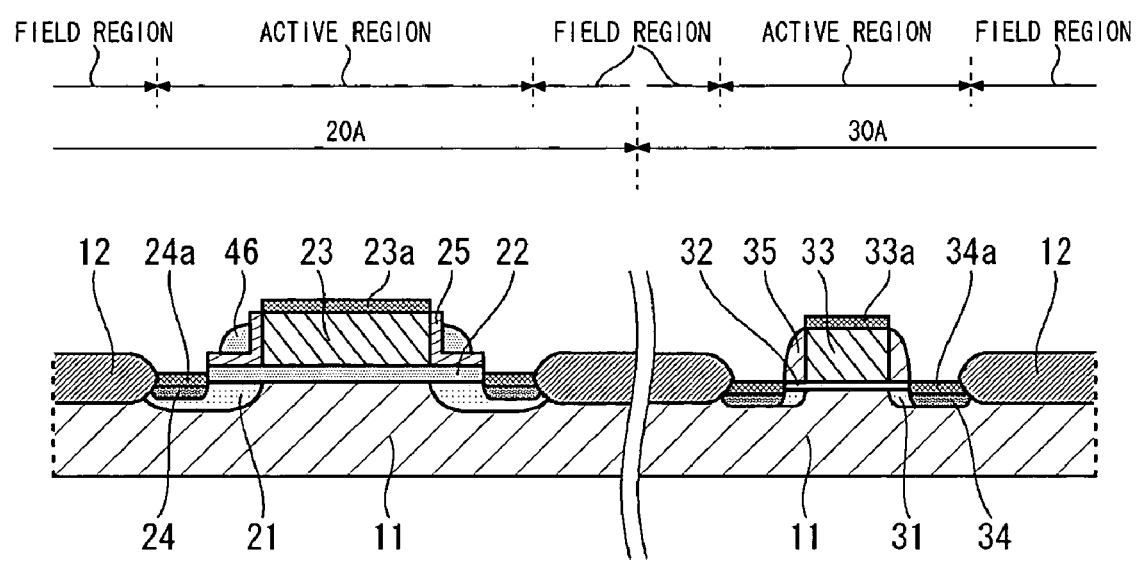

When the upper surfaces of the highly doped diffusion layers 24 and 34 are exposed as described above, a high-melting point metal such as cobalt (Co) or titanium (Ti) is deposited on the substrate where the high voltage MOSFET 20 and the low voltage MOSFET 30 are formed, and then a thermal treatment is performed. By this process, heat reactions respectively occur between the upper surfaces of the gate electrodes 23 and 33 and the upper surfaces of the highly doped diffusion layers 24 and 34, which results in forming salicide films 23a, 33a, 24a, and 34a, as shown in FIG. 5C. The high-melting point metal that did not heat-react is to be removed.

After that, as shown in FIG. 1, an inter-layer insulation film 17 made of silicon oxide ($SiO_2$) with a thickness preferably of about 10000 Å, for instance, is formed on the substrate where the high voltage MOSFET 20 and the low voltage MOSFET 30 are formed, using the CVD method, for example. Then, in this inter-layer insulation film 17, contact holes respectively reaching the salicide films 23a, 33a, 24a, and 34a, respectively, are opened. Then, by depositing conductors such as tungsten (W) in those contact holes using the CVD method, a sputtering method and so on, for example, contacts 18 that are electrically and respectively connected with the salicide films 23a, 33a, 24a, and 34a are formed. Next, metal wiring layers 19 aligned with the contacts 18 are formed on the inter-layer insulation film 17. By this arrangement, electrical contact parts (i.e. the gate electrodes 23 and 33, the highly doped diffusion layers 24 and 34) in the high voltage MOSFET 20 and in the low voltage MOSFET 30 are pulled out on the inter-layer insulation film 17. By the processes described above, the semiconductor device 1 as shown in FIG. 1 can be manufactured.

Operation Effect

As described above, according to this embodiment, two kinds of insulation films (25A, 26A) made of different materials are formed, and then etched using the difference in their etching rate. By such arrangement, a composition (the sidewall spacers 46 and the insulation films 25) that specifies the inter-electrode offset regions 20B in the high voltage MOSFET 20, and a composition (the sidewall spacers 35) that specifies the inter-electrode offset regions 30B in the low voltage MOSFET 30 are formed. Therefore, according to this embodiment, it is possible to set easily different inter-electrode offset distance with respect to the high voltage MOSFET 20 and the low voltage MOSFET 30.

Moreover, in this embodiment, the sidewall spacers 46 and the insulation films 25, and the sidewall spacers 35, which respectively specify the inter-electrode offset distance in the high voltage MOSFET and in the low voltage MOSFET, function as compositions that protect the diffusion layers 21 and 31 in the inter-electrode offset regions 20B and 30B from the ions that are implanted in forming the highly doped diffusion layers 24 and 34. Therefore, according to this embodiment, even when the SALICIDE technique is applied in the manufacturing process, it is possible to prevent the upper surfaces of the diffusion layers 21 and 31 from being silicided. In other words, according to this embodiment, it is possible to avoid an undesirable situation in which the inter-electrode offset distance in the high voltage MOSFET 20 becomes as short as the inter-electrode offset distance in the low voltage MOSFET 30, even if the SALICIDE technique is applied in the manufacturing process. Accordingly, with the structure of this embodiment, it is possible to manufacture easily the semiconductor device 1 including the high voltage MOSFET 20, which is capable of the high withstand voltage operation while applying the SALICIDE technique.

Moreover, according to this embodiment, it is possible to change easily the inter-electrode offset distance in the high voltage MOSFET 20 by changing the film thickness (height) of the gate electrode 23 and the thickness of the insulation film 26A before being processed into the sidewall spacers 26. In other words, with this embodiment, it is possible to optimize easily the inter-electrode offset distance in the inter-electrode offset region 20B according to the specification of the high voltage MOSFET 20.

Furthermore, the structure in the manufacturing method of this embodiment can be inexpensively modified from the structure in the conventional manufacturing method of a semiconductor device. Specifically, in the manufacturing method of this embodiment, the process of forming the sidewall spacers in the conventional manufacturing method is replaced with the process of forming the sidewall spacers 46 and the insulation films 25. Therefore, the manufacturing method of this embodiment can be easily put into practice at a low cost.

In addition, according to the manufacturing method of this embodiment, it is possible to form the highly doped diffusion layers 24 in the high voltage MOSFET regions 20A and the highly doped diffusion layers 34 in the low voltage MOSFET regions 30A in a single process. Therefore, the manufacturing method of a semiconductor device can be simplified.

As used herein, the following directional terms "forward, rearward, above, downward, vertical, horizontal, below and transverse" as well as any other similar directional terms refer to those directions of a device equipped with the present invention. Accordingly, these terms, as utilized to describe the present invention should be interpreted relative to a device equipped with the present invention.

Alternate Embodiments

Alternate embodiments will now be explained. In view of the similarity between the first and alternate embodiments, the parts of the alternate embodiments that are identical to the parts of the first embodiment will be given the same reference numerals as the parts of the first embodiment. Moreover, the descriptions of the parts of the alternate embodiments that are identical to the parts of the first embodiment may be omitted for the sake of brevity.

(2) Second Embodiment

Next, a second preferred embodiment of the present invention will be described in detail with reference to the drawings. In addition, in the following, with regards to the structure of components that are the same as those of the first embodiment, the same reference numbers will be used, and redundant explanations of those structure elements will be omitted.

Structure

In this embodiment, another manufacturing method of the semiconductor device according to the first embodiment of the present invention will be explained. Accordingly, a semiconductor device according to this embodiment has the same or similar structure as the semiconductor device 1 according to the first embodiment. In the following, the structure of the semiconductor device 1 according to the first embodiment is referred, and redundant explanations of the structure thereof will be omitted.

Manufacturing Method

Figure 6A:
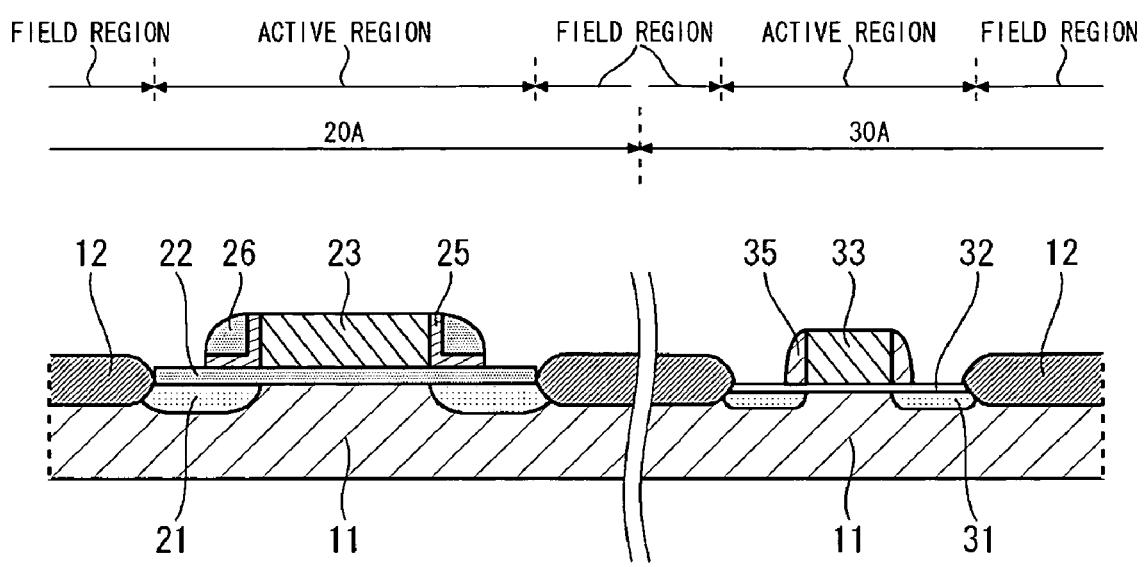
FIGS. 6A to 6d are views of process diagrams showing manufacturing processes in a manufacturing method of the semiconductor device according to the second embodiment of the present invention.

Next, a manufacturing method of the semiconductor device 1 according to the second embodiment will be described with reference to drawings. In this particular embodiment, the structure shown in FIG. 6A is formed through the processes shown in FIGS. 2A to 4C. In addition, the structure shown in FIG. 6A is substantially the same as the structure shown in FIG. 4C.

Figure 6B:
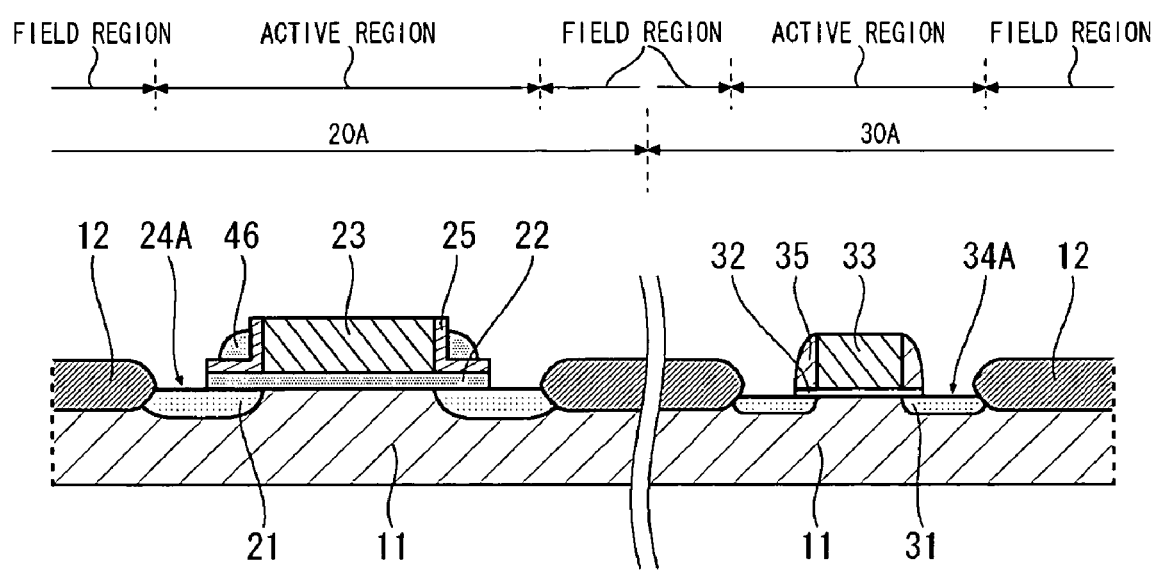

Next, as shown in FIG. 6B, the exposed parts of the gate insulation film 22, i.e. the parts of the gate insulation film 22 that are located in the regions besides the lower part of the gate electrode 23 and the inter-electrode offset regions 20B, and the exposed parts of the gate insulation film 32, i.e. the parts of the gate insulation film 32 that are located in the regions beside the lower part of the gate electrode 33 and the inter-electrode offset region 30B, are etched under certain predetermined etching conditions by which a sufficient selection ratio between the gate insulation film 22 and 32 made of silicon oxide ($SiO_2$), and the insulation films 25 and the sidewall spacers 35 made of silicon nitride (SiN) can be acquired when the etching is actually performed. In other words, the etching process is performed under the conditions by which only silicon oxide ($SiO_2$) can be selectively etched as opposed to silicon nitride (SiN). Through this etching process, as shown in FIG. 6B, apertures 24A that penetrate to the diffusion layers 21 and apertures 34A which penetrate to the diffusion layers 31 are respectively formed, and parts of the upper surfaces of the diffusion layers 21 and 31 are exposed. At this time, since the sidewall spacers 26, which are made of the same material (i.e. silicon oxide ($SiO_2$)) as the gate insulation film 22, are also etched, the sidewall spacers 26 change into sidewall spacers 46 with a thickness (in the horizontal direction) preferably of about 4500 Å, which is thinner than the original sidewall spacers 26 by the thickness of the gate insulation film 22, which for instance is preferably about 500 Å. With respect to the predetermined etching conditions for the etching process, for instance, using a mixed gas of $CF_4/CHF_3$ with a mixture rate of about 1:10 as an etching gas, etc. can be included. Furthermore, the resist 24C covering the high voltage MOSFET region 20A is to be removed after the apertures 34A are formed. Under the predetermined etching conditions as mentioned above, since a sufficient etching rate can be acquired with respect to silicon (Si) and silicon oxide ($SiO_2$), it is possible to set the etching amount based on the thicker film (gate insulation film 22). Therefore, it is possible to etch each gate insulation film (22 and 33) down to the surface of the diffusion layer (21 and 31) with precision.

Figure 6C:
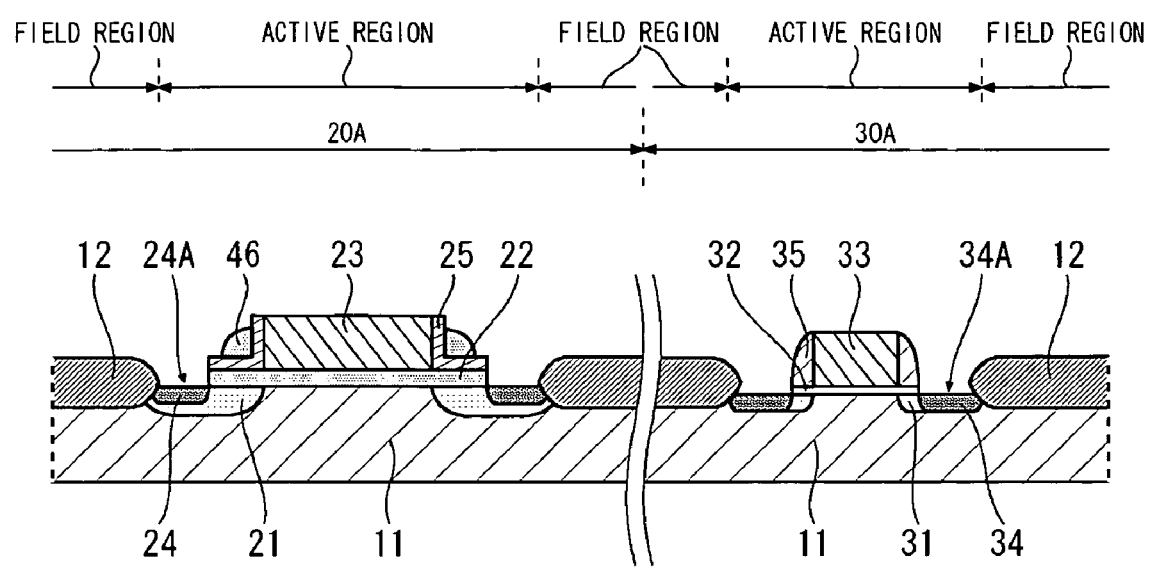

When the upper surfaces of the diffusion layers 21 and 31 except for the inter-electrode offset regions 20B and 30B as describe above, as shown in FIG. 6C, the highly doped diffusion layers 24 and 34 are formed in the upper part of each exposed diffusion layers 21 and 31, i.e. the upper parts of the diffusion layers 21 and 31 except for the inter-electrode offset regions 20B and 30B. As mentioned above, the highly doped diffusion layers 24 and 34 respectively function as the source and drain electrodes. In this process, negative ions (e.g. phosphorous ions) are implanted using the ionic implantation technique, for example. Here the dose amount of the negative ions for the ionic implantation may be set to be about $2.0E15/cm^2$, for example. In addition, since the implanted regions are exposed with the apertures 24A and 34A, it is possible to implant the negative ions with an energy, for instance 20 KeV, which is lower than the energy for forming the highly doped diffusion layers 24 and 34 in the first embodiment. Furthermore, since the field oxides 12, the gate electrode 23 and 33, the insulation films 25, the sidewall spacers 46 and 35 function as a mask, the negative ions should be respectively implanted into predetermined regions, for example the highly doped diffusion layers 24 in FIG. 1, within the high voltage MOSFET regions 20A and into predetermined regions, for example the highly doped diffusion layers 34 in FIG. 1, within the low voltage MOSFET regions 30A, respectively, in a self-aligning manner. In this way, in this embodiment, the highly doped diffusion layers 24 and 34 can be formed with less energy, while making it possible to form the highly doped diffusion layers 24 in the high voltage MOSFET region 20A and the highly doped diffusion layers 34 in the low voltage MOSFET region 30A at the same time.

Figure 6D:
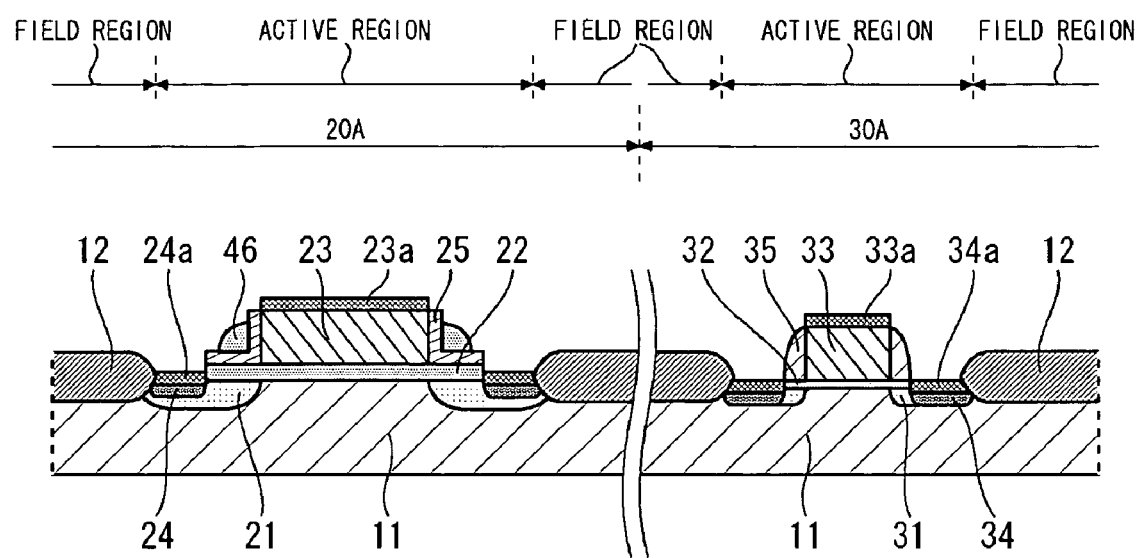

When the highly doped diffusion layers 24 and 34 are formed as described above, a high-melting point metal such as cobalt (Co) or titanium (Ti) is deposited on the substrate where the high voltage MOSFET 20 and the low voltage MOSFET 30 are formed, and then a thermal treatment is performed. By this process, heat reactions occur between the upper surfaces of the gate electrodes 23 and 33 and the upper surfaces of the highly doped diffusion layers 24 and 34, respectively, which results in forming salicide films 23a, 33a, 24a, and 34a, as shown in FIG. 6D. The high-melting point metal that did not heat-react is to be removed.

After that, as shown in FIG. 1, an inter-layer insulation film 17 made of silicon oxide ($SiO_2$) with a thickness preferably of about 10000 Å, for instance, is formed on the substrate where the high voltage MOSFET 20 and the low voltage MOSFET 30 are formed, using the CVD method, for example. Then, in this inter-layer insulation film 17, contact holes reaching the salicide films 23a, 33a, 24a, and 34a, respectively, are opened. Then, by depositing conductors such as tungsten (W) in those contact holes using the CVD method, a sputtering method, and so on, for example, contacts 18 that are electrically and respectively connected with the salicide films 23a, 33a, 24a, and 34a are formed. Next, metal wiring layers 19 aligned with the contacts 18 are formed on the inter-layer insulation film 17. By this arrangement, electrical contact parts (i.e. the gate electrodes 23 and 33, the highly doped diffusion layers 24 and 34) in the high voltage MOSFET 20 and in the low voltage MOSFET 30 are pulled out on the inter-layer insulation film 17. By the processes described above, the semiconductor device 1 as shown in FIG. 1 can be manufactured.

Operation Effect

As described above, according to this embodiment, as with the first embodiment, two kinds of insulation films (25A and 26A) made of different materials are formed, and then etched using the difference in their etching rate. By such arrangement, a composition (the sidewall spacers 46 and the insulation films 25) that specifies the inter-electrode offset regions 20B in the high voltage MOSFET 20, and a composition (the sidewall spacers 35) that specifies the inter-electrode offset regions 30B in the low voltage MOSFET 30 are formed. Therefore, according to this embodiment, it is possible to set easily different inter-electrode offset distances with respect to the high voltage MOSFET 20 and the low voltage MOSFET 30.

Moreover, in this embodiment, as with the first embodiment, the sidewall spacers 46 and the insulation films 25, and the sidewall spacers 35, which respectively specify the inter-electrode offset distance in the high voltage MOSFET and in the low voltage MOSFET, function as compositions that protect the diffusion layers 21 and 31 in the inter-electrode offset regions 20B and 30B from the ions which are implanted in forming the highly doped diffusion layers 24 and 34. Therefore, according to this embodiment, even when the SALICIDE technique is applied in the manufacturing process, it is possible to prevent the upper surfaces of the diffusion layers 21 and 31 from being silicided. In other words, according to this embodiment, it is possible to avoid the undesirable situation in which the inter-electrode offset distance in the high voltage MOSFET 20 becomes as short as the inter-electrode offset distance in the low voltage MOSFET 30, even if the SALICIDE technique is applied in the manufacturing process. Accordingly, with the structure of this embodiment, it is possible to manufacture easily the semiconductor device 1 including the high voltage MOSFET 20 that is capable of the high withstand voltage operation, while applying the SALICIDE technique.

Moreover, according to this embodiment, as with the first embodiment, it is possible to change easily the inter-electrode offset distance in the high voltage MOSFET 20 by changing the film thickness (height) of the gate electrode 23 and the thickness of the insulation film 26A before being processed into the sidewall spacers 26. In other words, with this embodiment, it is possible to optimize easily the inter-electrode offset distance in the inter-electrode offset region 20B according to the specification of the high voltage MOSFET 20.

Furthermore, the structure in the manufacturing method of this embodiment can be inexpensively modified from the structure in the conventional manufacturing method of a semiconductor device, as with the first embodiment. Specifically, in the manufacturing method of this embodiment, the process of forming the sidewall spacers in the conventional manufacturing method is replaced with the process of forming the sidewall spacers 46 and the insulation films 25. Therefore, the manufacturing method of this embodiment can be easily put into practice at a low cost.

In addition, according to the manufacturing method of this embodiment, it is possible to form the highly doped diffusion layers 24 in the high voltage MOSFET regions 20A and the highly doped diffusion layers 34 in the low voltage MOSFET regions 30A in a single process. Therefore, the manufacturing method of a semiconductor device can be simplified. Moreover, the upper surface of the regions which turn into the highly doped diffusion layers 24 and 34 are exposed before the highly diffusion layers 24 and 34 are formed. Therefore, it is possible to form the highly doped diffusion layers 24 and 34 with less energy.

Furthermore, according to the manufacturing method of this embodiment, after etching the insulation film 25A, the gate insulation films 22 and 32 are etched continuously. Therefore, in these processes, transfer of a semiconductor wafer is not required. In other words, it becomes possible to reduce the time and effort in the manufacturing process.

Although an n-type high voltage MOSFET and an n-type low voltage MOSFET have been referenced to in the above descriptions of the first and second embodiments, the present invention is not limited to this factor. For instance, by switching the impurity (ion), the present invention can be applied to a p-type high voltage MOSFET and a p-type low voltage MOSFET as well.

Although two kinds of gate insulation films (22 and 32) with different thickness are used in the first and second embodiments as described above, the present invention is not limited to this factor. For instance, the present invention can be applied to a case where more than three kinds of gate insulation films with different thickness are used or to a case where only one kind of gate insulation film is used.

Figure 7:
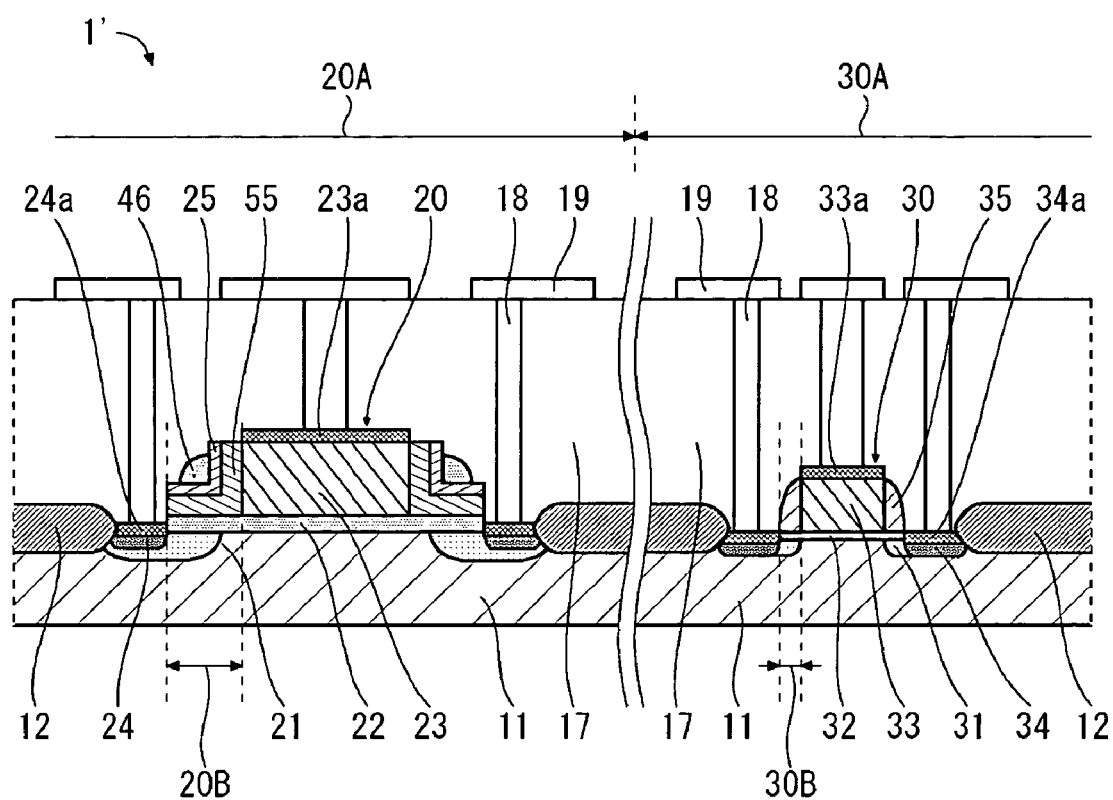
FIG. 7 is a cross-sectional view showing a structure of a semiconductor device 1' according to a modified example of the first and second embodiments of the present invention.

As described above, in the first and second embodiments, two kinds of insulation films (25A and 26A) are used in forming the sidewall spacers and the insulation film which specify the inter-electrode offset regions in the high voltage MOSFET region. However, the present invention is not limited to this factor. For instance, as shown in FIG. 7, more than three kinds of insulation films (e.g. insulation films 25, 55, and those insulation films before being processed into the sidewall spacers 26) can be used in forming the sidewall spacers 26 and the more than one insulation film 25 and 55 that specify the inter-electrode offset regions in the high voltage MOSFET region.

Furthermore, in accordance with the present invention, it is possible to use at least one of the two kinds of insulation films more than once to form the sidewall spacers and more than one insulation film which specify the inter-electrode offset regions in the high voltage MOSFET region. For instance, as shown in FIG. 7, the insulation film 55 can be a laminated structure including a layer made of the material forming the insulation film 25 and a layer made of the material forming the sidewall spacers 46.

In this way, according to the present invention, it is possible to form sidewall spacers (including the insulation film) having of a single layer or more than three layers on the sides of the gate electrode 23 of the high voltage MOSFET 30. It is preferable that the material forming the insulation film 55 in FIG. 7 is an insulating material having an etching rate that is different from that of at least one of the insulation film 25 and the sidewall spacers 46 under predetermined conditions. This means that the insulation film 55 should be selectively etched as opposed to at least one of the insulation film 25 and the sidewall spacers, under the predetermined conditions.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A method of manufacturing a semiconductor device, comprising:
   preparing a semiconductor substrate having first and second active regions;
   forming respectively first gate insulation films on surfaces of said first and second active regions by thermal oxidization;
   removing said first gate insulation film in said second active region;
   forming a second gate insulation film at an exposed surface of said second active region by thermal oxidization;
   forming a first gate electrode on said first gate insulation film and a second gate electrode on said second gate insulation film;
   forming a pair of first diffusion layers in said first active region by applying a first ionic implantation into said first active region while using said first gate electrode as a mask;
   forming a pair of second diffusion layers in said second active region by applying a second ionic implantation into said second active region while using said second gate electrode as a mask,
   wherein the first and second ionic implantations are carried out non-simultaneously, and the first and second diffusion layers have a same conductivity type,
   forming a first insulation film on said first and second gate insulation films and said first and second gate electrodes;
   forming first sidewall spacers directly on said first insulation film to cover sides of the first gate electrode, after the first ionic implantation, the first insulation film is interposed between said first sidewall spacers and said first gate electrode, and forming second sidewall spacers directly on said first insulation film to cover sides of the second gate electrode, after the second ionic implantation, the first insulation film is interposed between said second sidewall spacers and said second gate electrode, the first and second sidewall spacers being formed simultaneously;
   a first etching to remove said second sidewall spacers, whereby said first sidewall spacers remain after said first etching;
   a second etching to remove portions of said first insulation film to expose upper surfaces of said first and second gate electrodes, to expose upper surfaces of said first gate insulation film not under said first sidewall spacers and said first gate electrode, to expose a part of upper surfaces of said second gate insulation film not under said second gate electrode, and to form third sidewall spacers made of the first insulation film on sidewalls of said second gate electrode; and forming first highly doped diffusion layers at upper parts of said first diffusion layers except for parts under said first insulation film, said first sidewall spacers, and said first gate electrode by applying a third ionic implantation into said first diffusion layers via said first gate insulation film, while forming second highly doped diffusion layers at upper parts of said second diffusion layers except for parts under said third sidewall spacers and said second gate electrode during the third ionic implantation into said second diffusion layers via said second gate insulation film, wherein said first gate electrode, said first diffusion layers, said first sidewall spacers, and said first highly doped diffusion layers in the first active region form a high-voltage transistor, and wherein said second gate electrode, said second diffusion layers, said third sidewall spacers, and said second highly doped diffusion layers in the second active region form a low-voltage transistor.

2. The method of manufacturing a semiconductor device according to claim 1, further comprising:

exposing said first and second highly doped diffusion layers by etching said exposed first and second gate insulation films; and forming salicide films on said surfaces of said exposed first and second gate electrodes and said exposed first and second highly doped diffusion layers.

3. The method of manufacturing a semiconductor device according to claim 1, wherein said first sidewall spacers are formed by forming a second insulation film on said first insulation film and applying anisotropic etching on said second insulation film under a first predetermined etching condition, an etching rate of said second insulation film being greater than an etching rate of said first insulation film under said same first predetermined etching condition, said upper surfaces of said first and second gate electrodes and said first and second gate insulation films are exposed during said second etching by etching said first insulation film under a second predetermined etching condition, an etching rate of said first insulation film being greater than an etching rate of said first sidewall spacers under said same second predetermined etching condition, and said third sidewall spacers are formed on said sides of said second gate electrode by etching said first insulation film under said second predetermined etching condition.

4. The method of manufacturing a semiconductor device according to claim 1, wherein said first insulation film is a silicon nitride film, said first sidewall spacers are silicon oxide films, said first sidewall spacers are formed by forming a second insulation film made of silicon oxide on said first insulation film and applying anisotropic etching on said second insulation film under a first predetermined etching condition, an etching rate of said second insulation film being greater than an etching rate of said first insulation film under said same first predetermined etching condition, said upper surfaces of said first and second gate electrodes and said first and second gate insulation films are exposed during said second etching by etching said first insulation film under a second predetermined etching condition, an etching rate of said first insulation film being greater than an etching rate of said first sidewall spacers under said same second predetermined etching condition, and said third sidewall spacers are formed on said sides of said second gate electrode by etching said first insulation film under said second predetermined etching condition.

5. The method of manufacturing a semiconductor device according to claim 1, wherein said first insulation film is a silicon nitride film, said first sidewall spacers are silicon oxide films, said first sidewall spacers are formed by forming a second insulation film made of silicon oxide on said first insulation film and applying anisotropic etching on said second insulation film using a mixed gas of $CF_4/CHF_3$ with a mixture rate of 1:10 as an etching gas, said upper surfaces of said first and second gate electrodes and said first and second gate insulation films are exposed during said second etching by etching said first insulation film using a mixed gas of $CHF_3/Ar/O_2$ with a mixture rate of 50:100:1 as an etching gas, and said third sidewall spacers are formed on said sides of said second gate electrode by etching said first insulation film using said mixed gas of $CHF_3/Ar/O_2$ with said mixed rate of 50:100:1 as said etching gas.

6. The method of manufacturing a semiconductor device according to claim 1, wherein a depth of the first diffusion layers is greater than a depth of the second diffusion layers.

7. The method of manufacturing a semiconductor device according to claim 1, wherein an impurity concentration of the second diffusion layers is greater than an impurity concentration of the first diffusion layers.

* * * * *